(12) United States Patent
Nakano et al.

(10) Patent No.: US 6,778,272 B2
(45) Date of Patent: Aug. 17, 2004

(54) METHOD OF PROCESSING A SEMICONDUCTOR DEVICE

(75) Inventors: Hiroyuki Nakano, Yokohama (JP); Toshihiko Nakata, Hiratsuka (JP); Masayoshi Serizawa, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 333 days.

(21) Appl. No.: 09/760,704

(22) Filed: Jan. 17, 2001

(65) Prior Publication Data

US 2001/0016430 A1 Aug. 23, 2001

Related U.S. Application Data

(63) Continuation-in-part of application No. 09/260,074, filed on Mar. 2, 1999, now Pat. No. 6,355,570.

(30) Foreign Application Priority Data

Jan. 17, 2000 (JP) .......................... 2000-010271

(51) Int. Cl.[7] .......................... H01L 21/00; G01N 15/02; G01N 21/00
(52) U.S. Cl. .......................... 356/336; 356/337; 356/342; 438/7; 438/9
(58) Field of Search .......................... 438/7, 9, 706, 438/709–712, 714; 356/335–343, 436, 431; 250/559.41; 118/723 E, 723 MA

(56) References Cited

U.S. PATENT DOCUMENTS 5,367,139 A    11/1994   Bennett et al. ........ 219/121.59
5,943,130 A  * 8/1999   Bonin et al. ................. 356/336
6,355,570 B1 * 3/2002   Nakata et al. ............... 438/706
6,576,559 B2 * 6/2003   Nakata et al. ............... 438/706
6,613,588 B2 * 9/2003   Nakano et al. ................ 438/9

FOREIGN PATENT DOCUMENTS

| JP | 57-118630 A | 7/1982 |
| JP | 3-25355 A   | 2/1991 |
| JP | 3-147317    | 6/1991 |
| JP | 06082358 A  | 3/1994 |
| JP | 06124902 A  | 5/1994 |
| JP | 10-213539   | 8/1998 |
| JP | 11-238723   | 8/1999 |
| JP | 11-251252   | 9/1999 |

* cited by examiner

*Primary Examiner*—Russell Adams
*Assistant Examiner*—Andrew Sever
(74) *Attorney, Agent, or Firm*—Antonelli, Terry, Stout & Kraus, LLP

(57) ABSTRACT

A method of processing a semiconductor device is provided with several steps, including the step of generating plasma in a processing chamber to form or process a thin firm on a semiconductor device. The step of scanning, through a window, intensity modulated laser beam, which is modulated at a desired frequency inside the processing chamber where the semiconductor device is being processed. The step of receiving by a sensor through the window a back scattered light being scattered from fine particles suspended in the processing chamber by the scanning laser and detecting the desired frequency component from a signal outputted from the sensor. From the detected frequency component information relating to quantity, size, and distribution of the fine particles illuminated by the laser beam inside the processing chamber is obtained. This information is then outputted.

20 Claims, 27 Drawing Sheets

(a)

(b)

(c)

(a)

(b)

METHOD OF PROCESSING A SEMICONDUCTOR DEVICE

CROSS REFERENCE TO RELATED APPLICATIONS

This application is a continuation-in-part (CIP) of U.S. patent application Ser. No. 09/260,074, filed on Mar. 2, 1999, entitled "SEMICONDUCTOR MANUFACTURING METHODS, PLASMA PROCESSING METHODS AND PLASMA PROCESSING APPARATUSES", now issued as U.S. Pat. No. 6,355,570, the subject matter of which is incorporated by reference herein.

BACKGROUND OF THE INVENTION

The present invention relates to a method of processing a specimen, such as semiconductor substrates and liquid crystal substrates. More specifically, the present invention relates to a method of processing a semiconductor device which includes an in-situ measuring feature that involves the measurement of particles suspended in a processing chamber (vacuum processing chamber) used for forming and processing (e.g., etching) a thin film.

Processes using plasma are widely used in semiconductor production and liquid crystal display apparatus substrate production, e.g., in etching apparatuses. FIG. 28 shows an example of a plasma processing apparatus in the form of a parallel electrodes type plasma etching apparatus. As shown, this type of apparatus uses a high-frequency signal from a signal generator 83 to modulate the output potential from a power amp 84. This high-frequency potential is split up into two components using a distributor 85 and the components are applied to an upper electrode 81 and a lower electrode 82, respectively, which are disposed in parallel to each other in a processing chamber. Discharge between the two electrodes 81, 82 generates a plasma 71 from an etching gas. Etching is performed on the semiconductor wafer, e.g., a semiconductor substrate (wafer) W. The high-frequency signal can be, for example, a signal with a frequency of approximately 400 kHz.

In this plasma etching apparatus, it is known that the etching reaction product from the plasma operation is also deposited on the wall surface of the plasma processing chamber or the electrodes. As time goes by, the product peels off and forms suspended fine particles. As soon as the etching operation is completed and the plasma discharge stops, these suspended fine particles drop onto the wafer and adhere thereto as contaminants, which reduces the circuit properties and causes visual pattern defects. Ultimately, these adhered contaminants reduce the yield late in a semiconductor apparatus fabrication line and reduce the reliability of the elements.

Many types of apparatus for inspecting wafers for contaminants that have adhered to the surface of the wafer have been proposed and implemented, but these types of apparatuses sample a wafer for inspection from a large number of wafers treated by a plasma processing apparatus. By the time the presence of a contaminant on the sample wafer is recognized, the processing of the other wafers in the lot has already begun. This leads to clusters of defects and a reduced yield. Also, evaluations performed after processing cannot determine the distribution or changes over time of contaminants inside the processing chamber.

Thus, there is a need in the field of semiconductor fabrication, liquid crystal fabrication, and related technology for performing in-situ real-time monitoring of the contamination status in processing chambers.

The sizes of fine particles suspended in the processing chamber range from submicrons to several hundred microns. In the semiconductor field, where the integration scale is growing to include 256 Mbit DRAMs (Dynamic Random Access Memory) and 1 Gbit DRAMs, the minimum circuit pattern width is decreasing to 0.25–0.18 microns. Thus, there is a need to detect contaminants having sizes down to the order of submicrons.

Conventional technologies for monitoring fine particles suspended in processing chambers (vacuum processing chambers), such as plasma processing chambers, are described in Japanese laid-open patent publication number 57-118630 (background technology 1), Japanese laid-open patent publication number 3-25355 (background technology 2), Japanese laid-open patent publication number 3-147317 (background technology 3), Japanese laid-open patent publication number 6-82358 (background technology 4), Japanese laid-open patent publication number 6-124902 (background technology 5), and Japanese laid-open patent publication number Hei 10-213539 (background technology 6).

The background technology 1 concerns a vaporization apparatus equipped with means for illuminating a reaction space with parallel light rays having a spectrum different from the spectrum of the self-emitted light of the reaction space; and means for receiving parallel light illumination and detecting light scattered by fine particles generated in the reaction space.

The background technology 2 concerns an apparatus for measuring fine particles that uses scattering of laser light to measure fine particles that have adhered to a semiconductor device substrate surface and suspended fine particles. The apparatus for measuring fine particles is equipped with a laser beam phase modulator generating two laser beams modulated at predetermined frequencies having identical wavelengths and mutual phase differences; an optical system which causes the two laser beams to intersect in a space containing the fine particles to be measured; an optical detection system receiving light scattered by the fine particles to be measured in the region where the two laser beams intersect and converting the light into an electrical signal; and a signal processor extracting a signal component from the electrical signal generated by the scattered light where the frequency is identical or twice the frequency of a phase modulation signal from the laser light phase modulator and the phase difference with the phase modulation signal is constant in time.

The background technology 3 concerns a method of measuring the contamination status in a reaction container that includes a step of performing scanning illumination with coherent light and generating scattered light in the reaction container and a step of detecting the scattered light in the reaction container. The scattered light is analyzed to measure the contamination status.

The background technology 4 concerns a particle detector equipped with laser means generating a laser beam; scanner means using the laser light to scan a region in a reaction chamber of a plasma processing apparatus containing particles to be measured; a video camera generating a video signal of laser light scattered by particles in the region) and means for processing and displaying an image from the video signal.

The background technology 5 concerns a plasma processing apparatus equipped with a camera device for observing a plasma generating region in a plasma processing chamber; a data processing module for processing an image obtained from the camera device to obtain desired information; and a control module for controlling at least one of the following elements to reduce particles based on information obtained by the data processing module: evacuating means; process gas introducing means; high-frequency potential applying means; and purge gas introducing means.

The background technology 6 concerns a fine particle sensor including a light emitter for sending out a light beam illuminating a space to be measured; a detector containing an optical detector and an optical system focusing the scattered light from the space to be measured and directing it to the optical detector, the arrangement being set up so that the optical detector generates a signal representing the intensity of the light directed toward the optical detector; a pulse detector connected to the optical detector to analyze the signal from the optical detector, and detecting pulses in the signal from the optical detector; and signal processing means containing an event detector detecting a series of pulses resulting from scattered light generated by fine particles accompanying multiple illuminations by the beam while it moves in the measurement space.

In the conventional technologies described above, a laser beam is sent in through an observation window disposed on a side surface of a processing apparatus. A different observation window from the laser entry observation window is disposed on the facing surface or another side surface to allow detection of front-scattering or side-scattering of the laser light. Thus, in these systems for detecting front-scattered light and side-scattered light, the illumination optical system and the detection optical system are formed as different units and two observation windows are needed to accommodate these systems. Also, optical axis adjustments and the like need to be performed for both the illumination and detection optical systems, making operation difficult.

Also, an observation window is almost always disposed on the side surface of a plasma processing chamber to allow monitoring of plasma emission and the like, but in many cases only one observation window is provided. Thus, the conventional methods that require two observation window cannot be implemented for fabrication devices with a processing chamber that only has one observation window.

Furthermore, in conventional systems that detect front-scattered light and side-scattered light, the illumination beam sent into the processing chamber is rotationally scanned. Observation of fine particle generation over the entire surface of the semiconductor wafer requires multiple observation windows and detection optical systems, leading to significant cost increases. Also, providing multiple observation windows and detection optical systems is extremely difficult in practice due to space factor restrictions.

In semiconductor fields where integration is proceeding to the levels of 256 Mbit DRAMs and 1 Gbit DRAMs, the minimum circuit pattern width is being reduced down to 0.25–0.18 microns, creating the need to detect contaminants with sizes on the order of submicrons. However, with the conventional technologies, separating light scattered by fine particles from plasma emission is difficult, so that these technologies have been restricted to use in measuring relatively large fine particles, while detection of very fine particles with sizes on the order of submicrons is difficult.

SUMMARY OF THE INVENTION

The present invention solves the problems which are described above.

According to feature of the embodiments of the present invention, a method of processing a semiconductor device comprises the steps of generating plasma in a processing chamber to form a thin film on a semiconductor device or to process a thin film formed on a semiconductor device, scanning a laser beam which is intensity modulated at a desired frequency inside the processing chamber where the semiconductor device is being processed by the plasma through a window, receiving by a sensor through the window a back scattered light being scattered from fine particles suspended in said processing chamber by scanning the laser, detecting said desired frequency component from a signal outputted from the sensor, obtaining information from the detected desired frequency component relating to quantity, size and distribution of fine particles illuminated by said laser beam inside the processing chamber, and outputting said obtained information relating to quantity, size and distribution of the fine particles.

According to another feature of the embodiments of the present invention, a method of processing a semiconductor device comprises the steps of coating resist on a surface of a substrate, exposing said resist coated on said substrate with a desired light pattern, developing said exposed resist, processing said substrate with plasma and the surface of the substrate which is partially covered with the developed resist, and removing said resist coated on the substrate on which said patterns are formed, wherein, in the processing step, the substrate is processed in a processing apparatus and a laser beam is scanned inside the processing apparatus through a window of the processing apparatus and a back scattered light from fine particles by the scanned laser beam is detected through the window.

According to another feature of the embodiments of the present invention, a method of processing a semiconductor device comprises the steps of forming a thin film on a substrate, coating a resist on said substrate on which said thin film is formed, exposing said resist with a light pattern by using an exposing apparatus, developing said exposed resist by using a developing apparatus, etching said thin film on which said resist is developed and forming hole patterns by using a plasma etching apparatus, and removing said resist coated and developed on said substrate on which said hole patterns are formed in said thin film, wherein, in said etching step, a laser beam is scanned inside said plasma etching apparatus where a plasma is generated and back-scattered light from fine particles suspended inside said plasma etching apparatus is detected by a sensor shielded from light reflected from a wall of said plasma etching apparatus.

Furthermore, according to another feature of the embodiments of the present invention, a method of processing a semiconductor device comprises the steps of loading a substrate into a chamber of a plasma etching apparatus, on a surface of the substrate, a resist pattern is formed, evacuating the inside of said chamber in which said substrate is loaded and supplying a process gas inside said chamber, applying high frequency power to an electrode of said plasma etching apparatus and generating plasma inside said chamber, processing said substrate with said plasma, illuminating a laser beam inside said chamber through a window of said plasma etching apparatus and detecting through said window a back-scattered light generated by fine particles suspended inside said chamber, and unloading said substrate from said plasma etching apparatus after stopping said supply of said process gas and evacuating said process gas from inside said chamber.

These and other objects, features and advantages of the invention will be apparent from the following more particular description of preferred embodiments of the invention, as illustrated in the accompanying drawings.

DETAILED DESCRIPTION OF THE PREFERRED EMBODIMENTS

Various embodiments of the present invention will be described with reference to FIG. 1 through FIG. 30.

The embodiments of the present invention described herein are implemented in parallel flat plasma etching apparatuses of the type used in plasma dry etching. However, the present invention is not restricted to this. The present invention can also be used in thin film forming apparatuses, e.g., sputtering apparatuses and CVD apparatuses, as well as various other types of thin film processing apparatuses, such as ECR etching apparatuses, microwave etching apparatuses, and ashing apparatuses.

Figure 1:
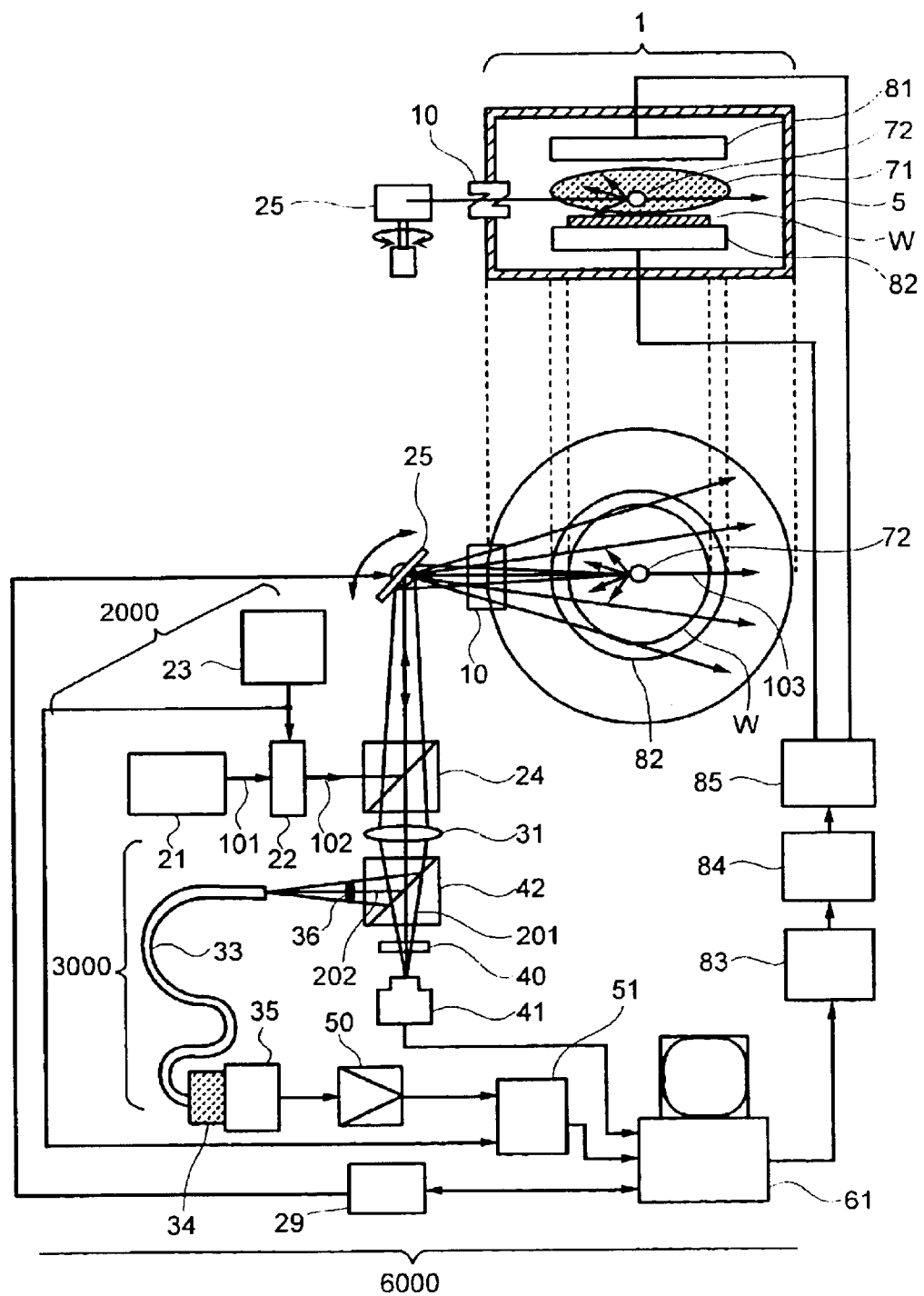
FIG. 1 is a schematic front-view of etching a device equipped with an apparatus for measuring fine particles suspended in plasma according to the present invention.
Figure 2:
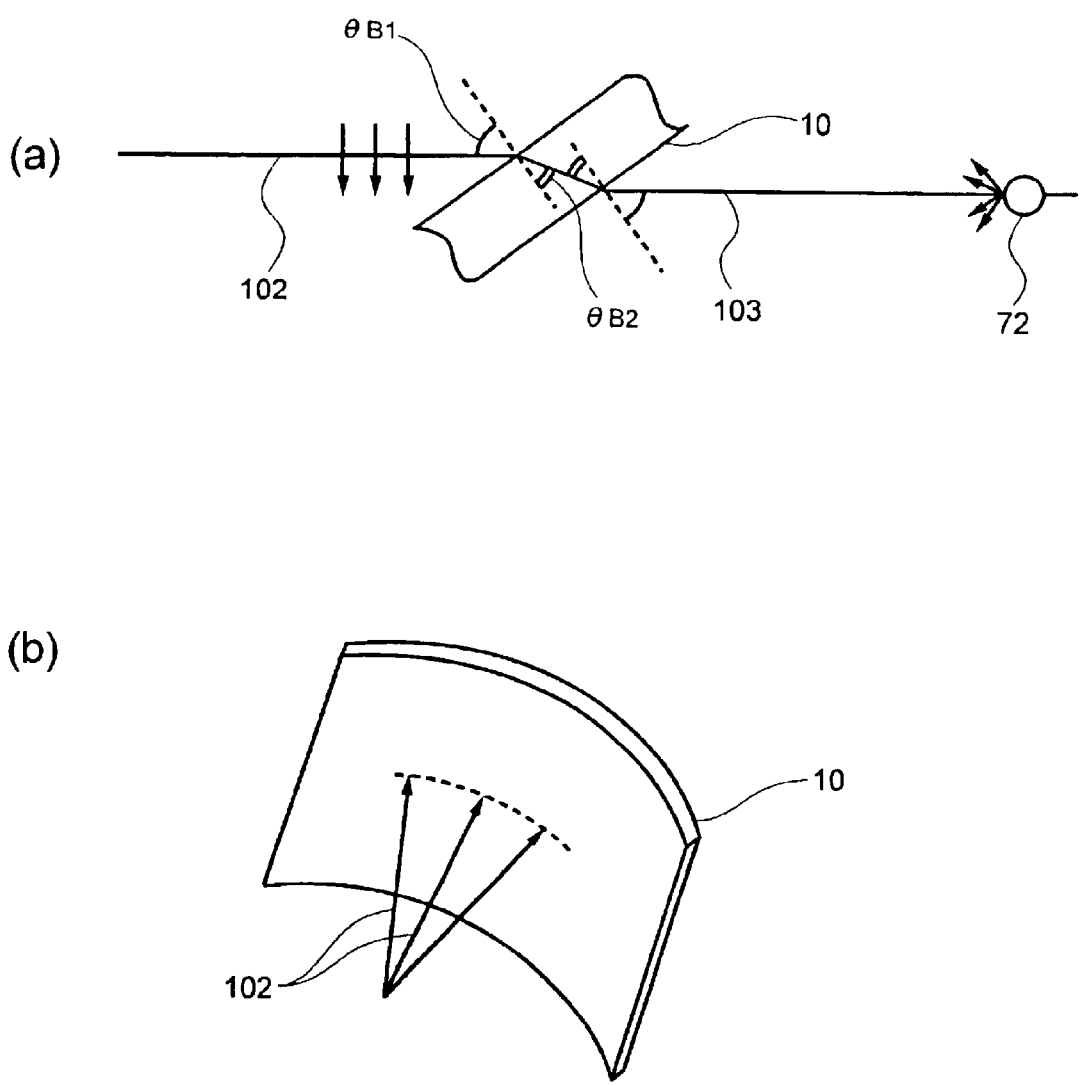
FIG. 2(a) is a diagram showing the entry angle of a laser beam to the observation window according to the present invention.
FIG. 2(b) is a diagram of an oblique view of the window.
Figure 3:
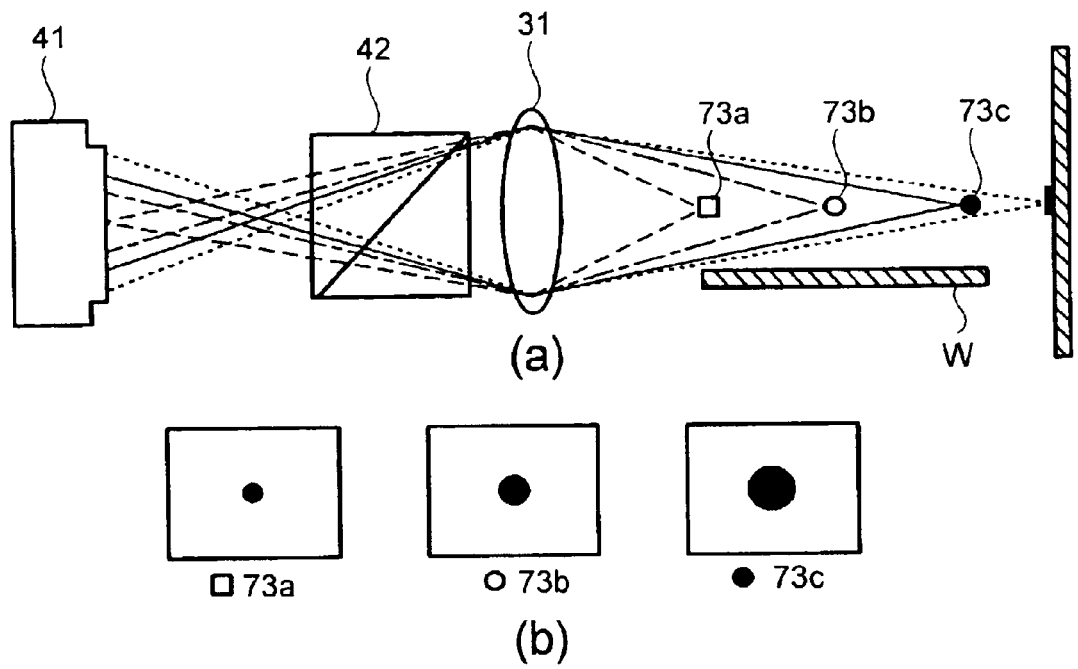
FIG. 3(a) is a side view showing an arrangement of a wafer, a lens, a beam splitter and a CCD camera according to the present invention.
FIG. 3(b) shows the size of the images obtained from the scattered light.

A plasma etching apparatus according to a first embodiment of the present invention will be described with reference to FIG. 1 through FIG. 8(b). FIG. 1 is a diagram showing the architecture of an etching apparatus 1 having a device for measuring very fine particles suspended in plasma.

In the etching apparatus 1 shown in FIG. 1, a high-frequency signal from a signal generator 83 modulates the output potential from a power amp 84. This high-frequency potential is split up into two components by a distributor 85, and the respective components are applied to an upper electrode 81 and a lower electrode 82, which are disposed in parallel to each other in a processing chamber 5. Discharge between the electrode 81 and the electrode 82 generates a plasma 71 from etching gas, and this results in the etching of a semiconductor substrate W, which is the item being processed. The high-frequency signal can be, for example, a 400 kHz signal.

The device for measuring very fine particles suspended in plasma is formed essentially from a laser illumination optical system 2000, a scattered light detecting optical system 3000, and a signal processing system 6000. The illumination output section and the detected light input section in the laser illumination optical system 2000 and the scattered light detecting optical system 3000 are disposed at an observation window 10 formed on a side surface of the processing chamber In the laser illumination optical system 2000, an S-polarized beam 101 emitted from a laser beam source 21 (e.g., a YAG secondary harmonic laser with a wavelength of 532 nm) is beamed to an AO (acousto-optical) modulator 22. A signal from an oscillator 23, e.g., a 170 kHz signal that is preferably a 50% duty rectangular-wave signal, is sent to the AO modulator 22 to provide intensity modulation at the frequency described above for the laser beam (S-polarized beam) 101. In this embodiment, which applies a high-frequency potential at 400 kHz to the electrodes of the etching apparatus, a laser intensity modulation frequency that is distinct from 400 kHz and the harmonic components 800 kHz, 1.2 MHz, . . . , e.g., the 170 kHz frequency described above, would be preferable. The reason for this will be described later.

The intensity-modulated beam 102 is reflected by a polarizing beam splatter 24 and a galvano-mirror 25 and is then guided to the processing chamber 5 by way of the observation window 10, which is disposed on a side surface of the processing chamber 5. The galvano-mirror 25 is rotated so that the beam scans a plane parallel to the wafer surface, thus allowing fine particles to be detected over the entire surface of the wafer.

As shown in FIG. 2(a), the observation window 10 is disposed at an angle so that a Brewster's angle θB1 is formed with the entry beam 102, which forms a P-polarized beam. The reflectivity of this plane is 0 for the entry beam, which is P-polarized light in theory. The Brewster's angle θB1 is expressed as θB1=tan~1 (n2/n1) (n1: refraction index of air, n2: refraction index of the glass in the observation window). When the laser wavelength is 532 nm and the glass used in the observation window 10 is synthetic quartz (1.46 refraction index at 532 nm), then θB1=55.6 deg. Similarly, for θB2, θB2=34.4 deg. As shown in FIG. 2(b), the observation window 10 is formed with a curved shape so that a constant slope is maintained with the entry beam 102 as the galvano-mirror 25 rotates to scan the entry beam 102.

The beam 103 guided into the processing chamber 5 is scattered by the fine particles 72 suspended in the plasma. Of the light scattered by the fine particles, the back-scattered light propagating with an optical axis identical to that of the beam 103 passes through the observation window 10 and is reflected by the galvano-mirror 25 so that it extends toward the polarizing beam splatter 24. Of this back scattered light, only the P-polarized light component passing through the polarizing beam splitter 24 is focused by an imaging lens 31.

The focused scattered light is separated by a beam splitter 42 into two beams 201, 202 in order to determine the sizes and positions of the fine particles. The beams are imaged or received by a CCD camera 41 and a fiber bundle 33.

The beam 201 which has passed through the beam splitter 42 then passes through an interference filter 40 having a center transmission frequency at the laser wavelength (532 nm). The wavelengths of the light scattered by the fine particles are separated from the rest of the light emitted from the plasma and imaged by the CCD camera 41. FIG. 3(a) shows a simplified view of how the CCD camera 41 images the scattered light. As FIG. 3(a) shows, a point 73a in front of the wafer is focused with relation to the entry plane of the CCD camera 41, while the images formed by the scattered light from a wafer center position 73b and a wafer rear position 73c are defocused. Thus, as FIG. 3(b) shows, the size of the images obtained from the scattered light are different even with the same fine particle. This allows information about the position of the fine particle to be obtained from the image. However, fine particles having different sizes cannot be identified. Thus, the sizes of fine particles are determined using the imaging signal and a signal obtained using the method described next.

Figure 4:
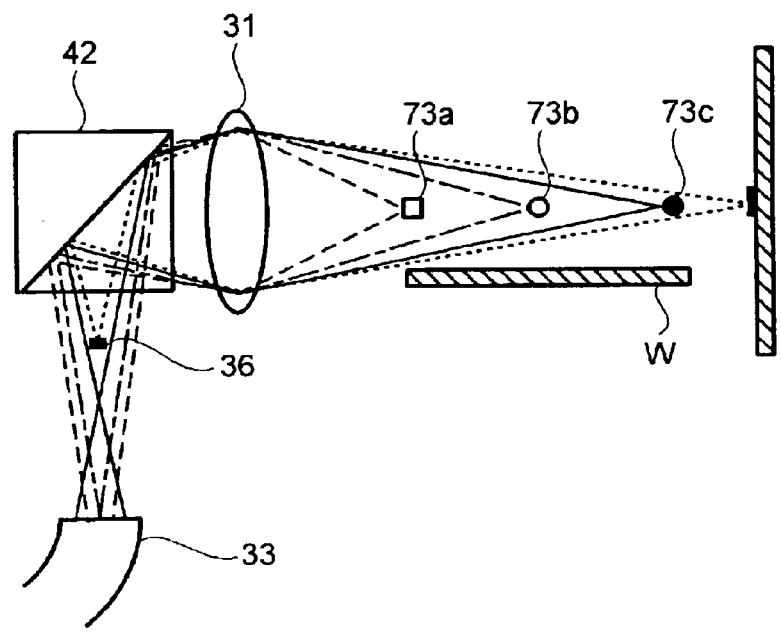
FIG. 4 is a side view of an arrangement of a wafer, a lens, a beam splitter and a fiber bundle according to the present invention.

The beam 202 reflected by the beam splatter 42 is focused into the entry plane of the fiber bundle 33 by the imaging lens 31. As FIG. 4 shows, the wafer center 73b forms an imaging relation with the entry plane of the fiber bundle 33. The fiber bundle region (light-receiving region) at the entry end plane has a size that allows detection of defocused scattered light from the wafer ends 73a, 73c. Thus, the back-scattered light from the fine particles can be detected at the same sensitivity from the front of the wafer to the back. Also, since the scattered light generated by the inner walls of the processing chamber 5 is imaged in front of the light-receiving plane of the fiber bundle 33, a spatial filter 36 is disposed at the imaging position to stop the light. The exit end of the fiber bundle 33 is connected to a spectroscope 34 such as a monochromator or an interference filter set up for the laser wavelength. After wavelength separation is performed on the light from the plasma emission that was back scattered by the fine particles, the light is then converted into electricity by a photoelectric converter 35.

The detection signal from the photoelectric conversion is amplified by an amp 50 having a bandwidth that is adequately wider than the laser modulation wavelength. Then, a lock-in amp 51 performs synchronization and detection using as a reference signal the 170 kHz frequency 50% duty signal output from the oscillator 23 for intensity modulation of the laser light. This extracts the 170 kHz back-scattered light of fine particles from the detection signal.

Figure 5:
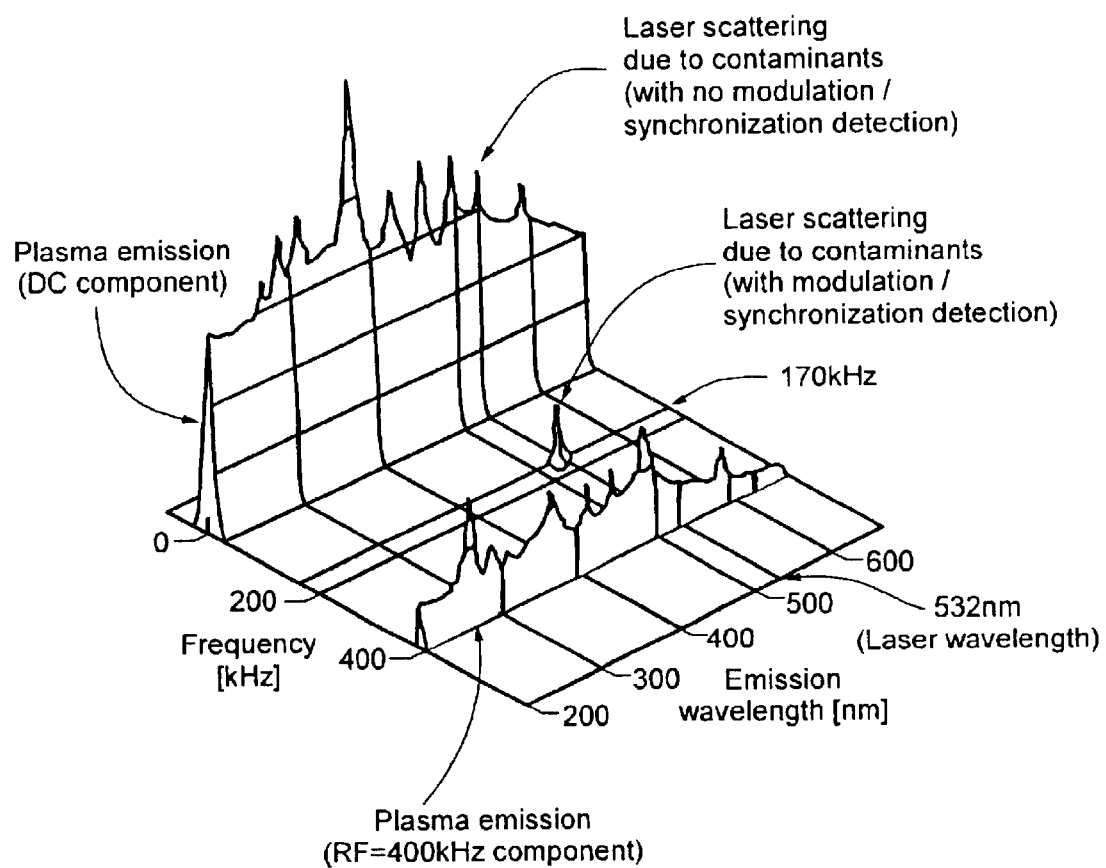
FIG. 5 is a three-dimensional graph which shows how wavelength/frequency separation is performed to separate light scattered by fine particles from plasma emission according to the present invention.

The inventors of this invention have determined through experiments that the intensity of the plasma emission is synchronized with the plasma excitation frequency. For example, wavelength separation is performed on the plasma emission generated by high-frequency electricity having the plasma excitation frequency of 400 Khz described above. A fine particle signal is obtained through modulation and synchronized detection using a signal with a frequency of 170 kHz, which is distinct from the plasma excitation frequency and integer multiples thereof As shown in FIG. 5, this fine particle signal is separated from the plasma emission in the wavelength and frequency domains. Experiments performed by the inventors of this invention show that this modulation/synchronization detection system provides high-sensitivity detection of very weak light scattered rearward from a plasma emission due to very fine particles.

As shown in FIG. 5, the plasma emission is distributed continuously over the wavelength domain, but is formed discretely over the frequency domain, with empty regions in the frequency domain. Thus, for example, a laser beam with a frequency of 532 nm is intensity modulated with a frequency distinct from the plasma emission frequency, e.g., a frequency of 170 kHz, and is beamed into the plasma processing chamber. When just the 532 nm wavelength component and the 170 kHz wavelength, i.e., just the peak signals, are extracted, the light scattered rearward by fine particles can be separated from the plasma emission and detected.

Thus, in this embodiment, the influence of light reflected from the observation window surface and the light scattered by the processing chamber walls, which can act as noise against rearward scattered light detection, is essentially eliminated. Furthermore, using the modulation/synchronization detection system described above, very weak signals caused by light scattering from fine particles can be detected with high sensitivity despite plasma emission noise, which can obstruct detection of fine particles in the plasma. Also, by detecting light scattered rearward, the laser illumination optical system and the scattered light detection optical system need be formed as a single unit, and the processing apparatus can be formed with only one observation window 10. Furthermore, compared to a system where the illumination optical system and the detection optical system are separate, this system allows easier optical adjustment and the like and provides a more compact optical system overall.

Figure 6:
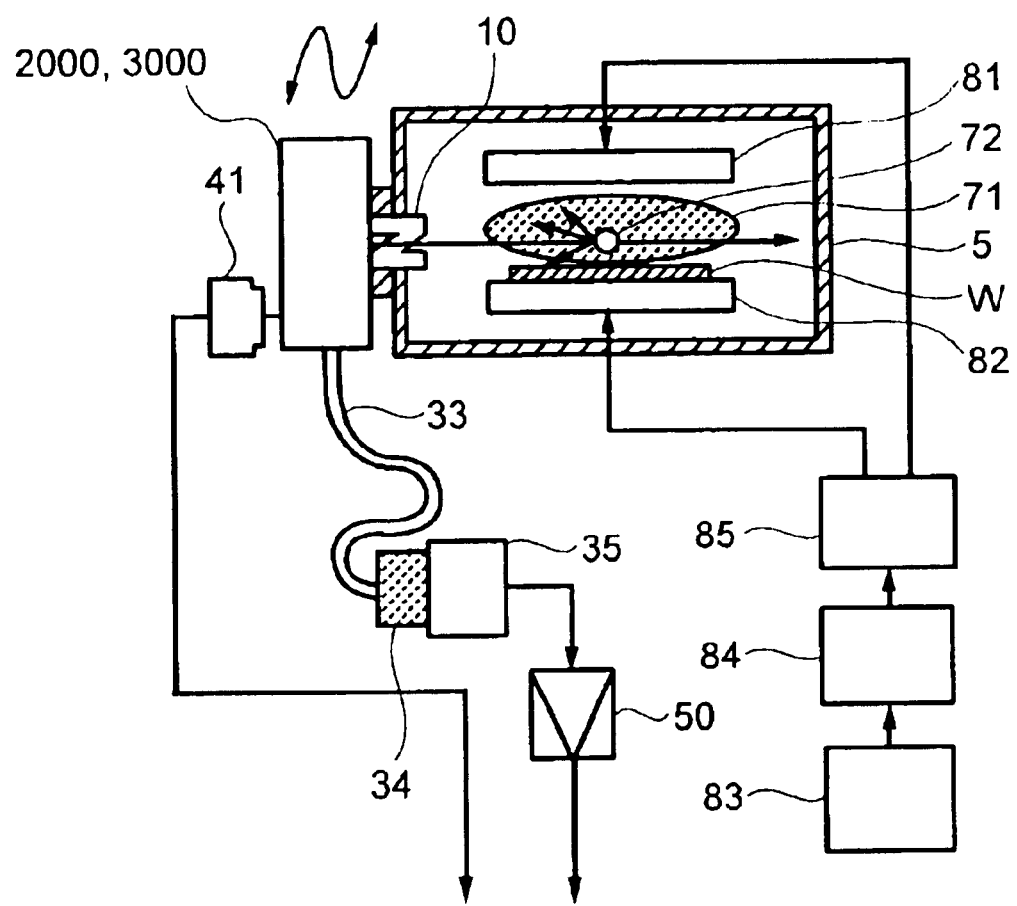
FIG. 6 is a front view of the plasma processing apparatus and shows the illumination/detection optical system slides in the apparatus for measuring fine particles suspended in plasma according to the present invention.

It is said that many suspended particles exist on the plasma sheath surface. The position of the plasma sheath surface may vary according to processing conditions, such as the distance between electrodes, and fine particles will also be present in places other than the plasma sheath. For this reason, this laser illumination optical system 2000 and the scattered light detection optical system 3000 are, as shown in FIG. 6, disposed parallel to the slope of the observation window 10 described above and can be moved diagonally up and down. With this structure, fine particles in the plasma can be detected at different heights.

Figure 7:
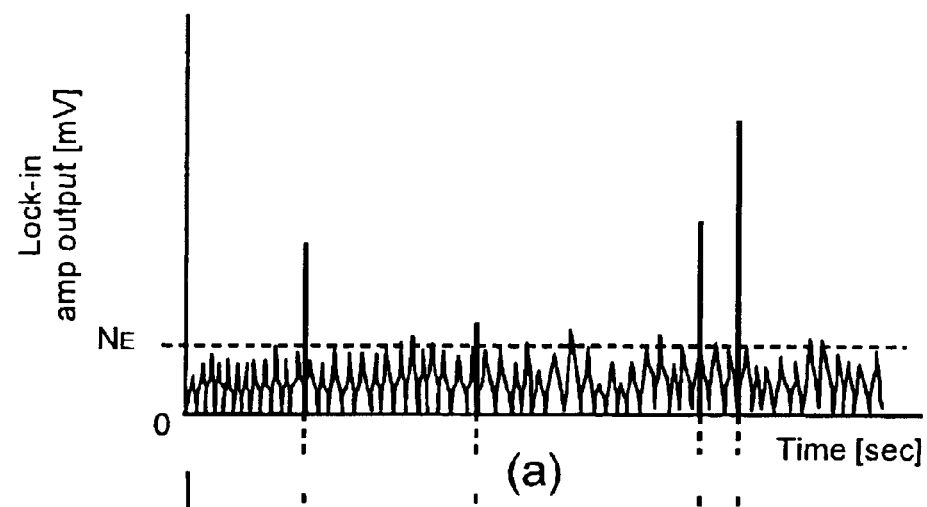
FIG. 7(a) is a graph of the detection signal.
FIG. 7(b) is a graph of the signal after threshold processing.
FIG. 7(c) is a diagram showing a sample of a display on a screen according to the present invention.
Figure 7:
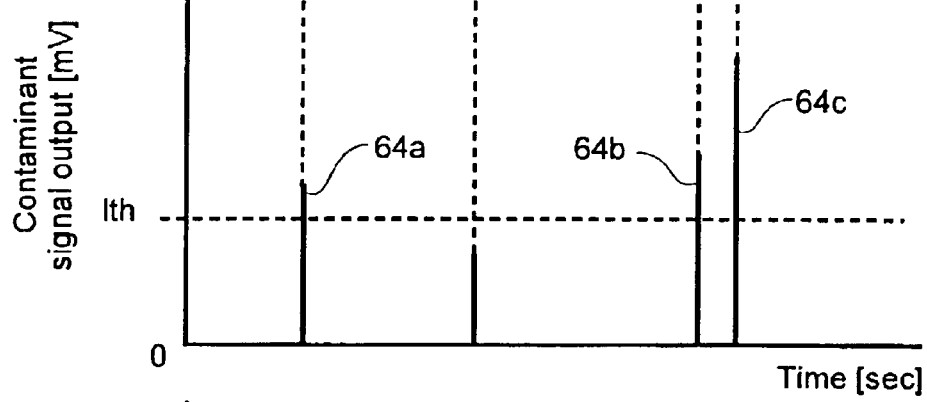
Figure 7:
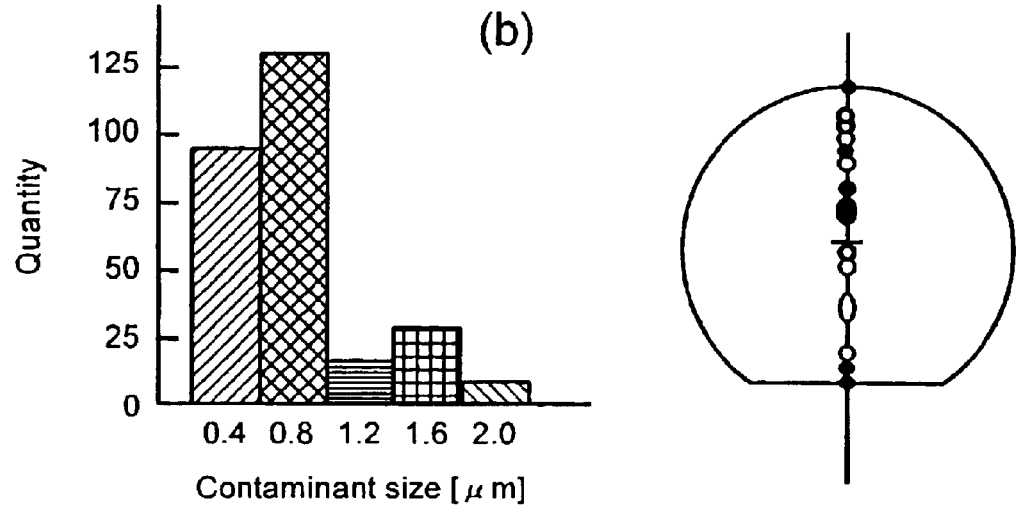

The output from the lock-in amp 51 is sent to a computer 61. The computer 61 provides a detailed display of the received signal as shown, for example, in FIG. 7(*a*). Since the detection signal contains electrical noise NE generated by the amp 50, the lock-in amp 51, and the like, a threshold value is used when displaying data. In FIG. 7(*b*), signals at or less than NE,are set to 0 mV and only the signals NE or greater are displayed. This makes the detection signal from back-scattered light of fine particles easier to evaluate.

In the signal processing system 6000, the intensity of the detection signal from the back-scattered light of fine particles as well as the images from the CCD camera 41 are used to evaluate the size, quantity, and position of the fine particles. Regarding the image from the CCD camera 41, a threshold value Ith is set for the lock-in amp output. A fine particle is assumed when the signal strength exceeds the threshold value Ith and an image is recorded.

Next, the computer 61 takes image data and signal intensities corresponding to particle diameters as obtained from prior testing and compares theme to the images and detection signal intensities of the back-scattered light from the fine particles. Based on this comparison, fine particle sizes, positions, and quantities are determined. The results are shown on a display such as shown in FIG. 7(*c*).

Figure 8:
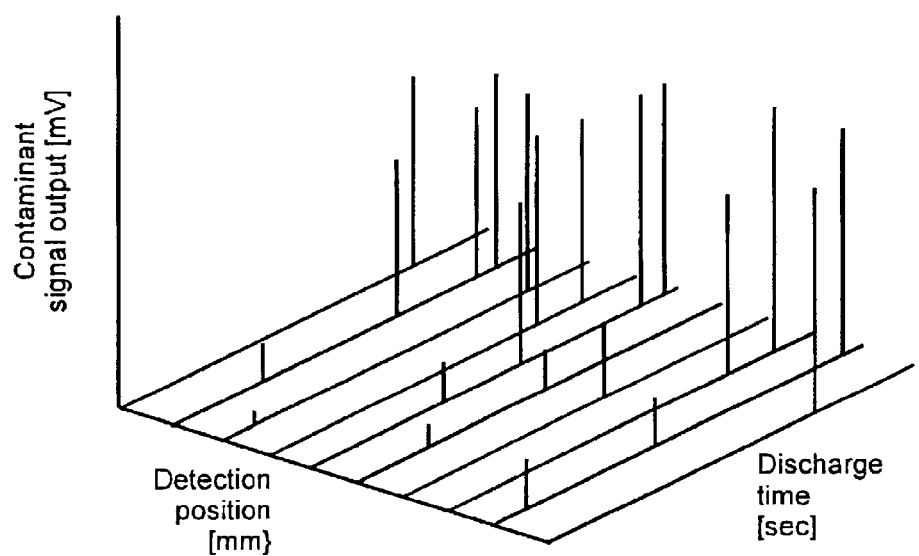
FIG. 8(a) is a three-dimensional graph of a detection signal.
FIG. 8(b) is diagram showing a sample of a display including a graph of the sizes and quantities of fine particles and a display of the two-dimensional distribution of fine particles according to the present invention.
Figure 8:
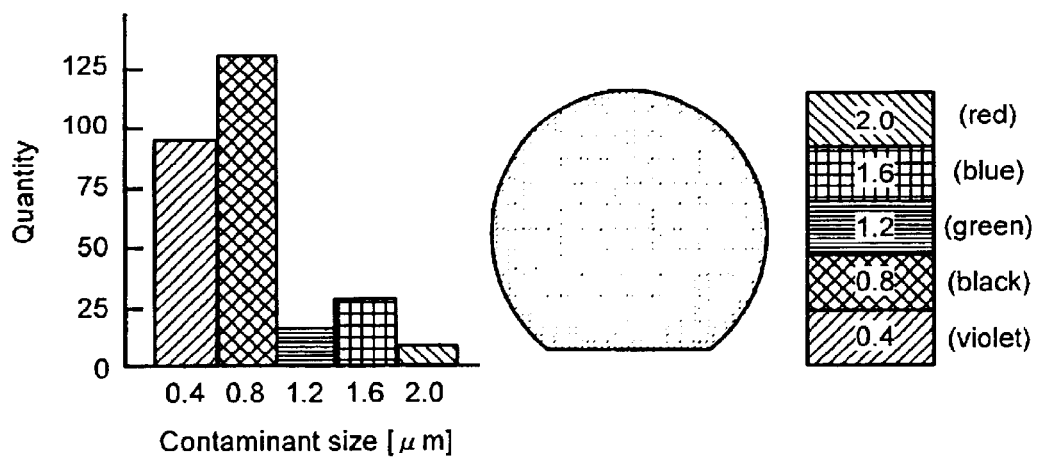

In this embodiment, the galvano-mirror 25 is used to scan the entire wafer surface. The computer 61 uses a galvano driver 29 to send a scan signal to the galvano-mirror 25 so that the beam is scanned while detection signals and images of the back-scattered light from the fine particles at scan positions can be captured in synchronization with the operations of the galvano-mirror. This provides an understanding of the two-dimensional distribution over the wafer surface, as shown in FIG. 8(*a*) and FIG. 8(*b*), in addition to the fine particle positions on the wafer's front/back axis.

Also, the computer 61 calculates the number of fine particles found and evaluates the contamination in the processing chamber. If the total number of fine particles exceeds a predetermined reference value, the etching operation is stopped. If an alarm is used to notify the operator as well, this information can be used so that the operator can perform cleaning operations and the like for the processing chamber.

With the embodiment described above, detection of back scattered light can be performed so that the effect of light reflected from the observation window surface and light scattered by the processing chamber walls, which can generate significant noise, are essentially eliminated. Furthermore, with the modulation/synchronized detection system described above, plasma emission noise, which can obstruct detection of particles suspended in plasma, is separated from weak fine particle scatter signals. This provides improved detection sensitivity and also allows detection of fine particles on the order of submicrons, something which was believed to be difficult with conventional methods.

Also, this embodiment allows detection to be performed by separating very weak light scattered by particles from plasma emissions in the wavelength and frequency domains. Compared to conventional methods that separate by wavelength only, this provides significant improvements in sensitivity for detection of fine particles suspended in plasma. In the conventional method of separating by wavelength, the minimum detection sensitivity was around 1 micron in diameter. In contrast, the method of the present invention can improve minimum detection sensitivity to 0.2 micron in diameter, allowing stable fine particle detection over the entire surface of the wafer. Further improvements in detection sensitivity can be obtained by the increasing scattering intensity through shortening of the laser wavelength, increasing the laser output, or both shortening the wavelength and increasing the output.

Also, since back-scattering detection is performed in this embodiment, the illumination and detection optical systems can be formed as a single unit. This allows easy attachment and adjustments and provides a compact apparatus for detecting fine particles. Also, since back-scattering detection is used, the illumination beam can be rotationally scanned in a horizontal direction, thus allowing the two-dimensional distribution of fine particles to be easily understood.

Furthermore, this embodiment provides an illumination/detection optical system which is able to slide diagonally upward and downward. This allows different plasma regions to be observed and allows the distribution of fine particles along the up/down direction to be determined. Since the illumination optical system and the detection optical system are formed as a single unit, the optical illumination/detection axis can stay aligned even if sliding is performed, eliminating the need for readjustments.

Furthermore, in this embodiment, the quantity, size, and distribution of fine particles is evaluated by performing fine particle detection over the entire wafer surface. This allows the operator to see the results on the display in real time.

Furthermore, in this embodiment, the contamination status of the processing chamber can be evaluated in real time based on the obtained quantity, size, and distribution information for the fine particles. This allows the timing at which cleaning is performed to be optimized, thus improving throughput, preventing clusters of defects, and improving yield. Also, since processing is performed while the quantity of fine particles in the processing chamber is continuously monitored, the semiconductor substrates and liquid crystal substrates produced in this manner will be highly reliable high-quality products that have been produced in an environment where the number of fine particles is kept under a predetermined reference value.

Also, this embodiment eliminates the need for evaluating the contamination status through the use of dummy wafers or random inspections. This reduces dummy wafer costs and improves throughput.

A second embodiment of the present invention will be described with reference to FIG. 9 and FIG. 10.

Figure 9:
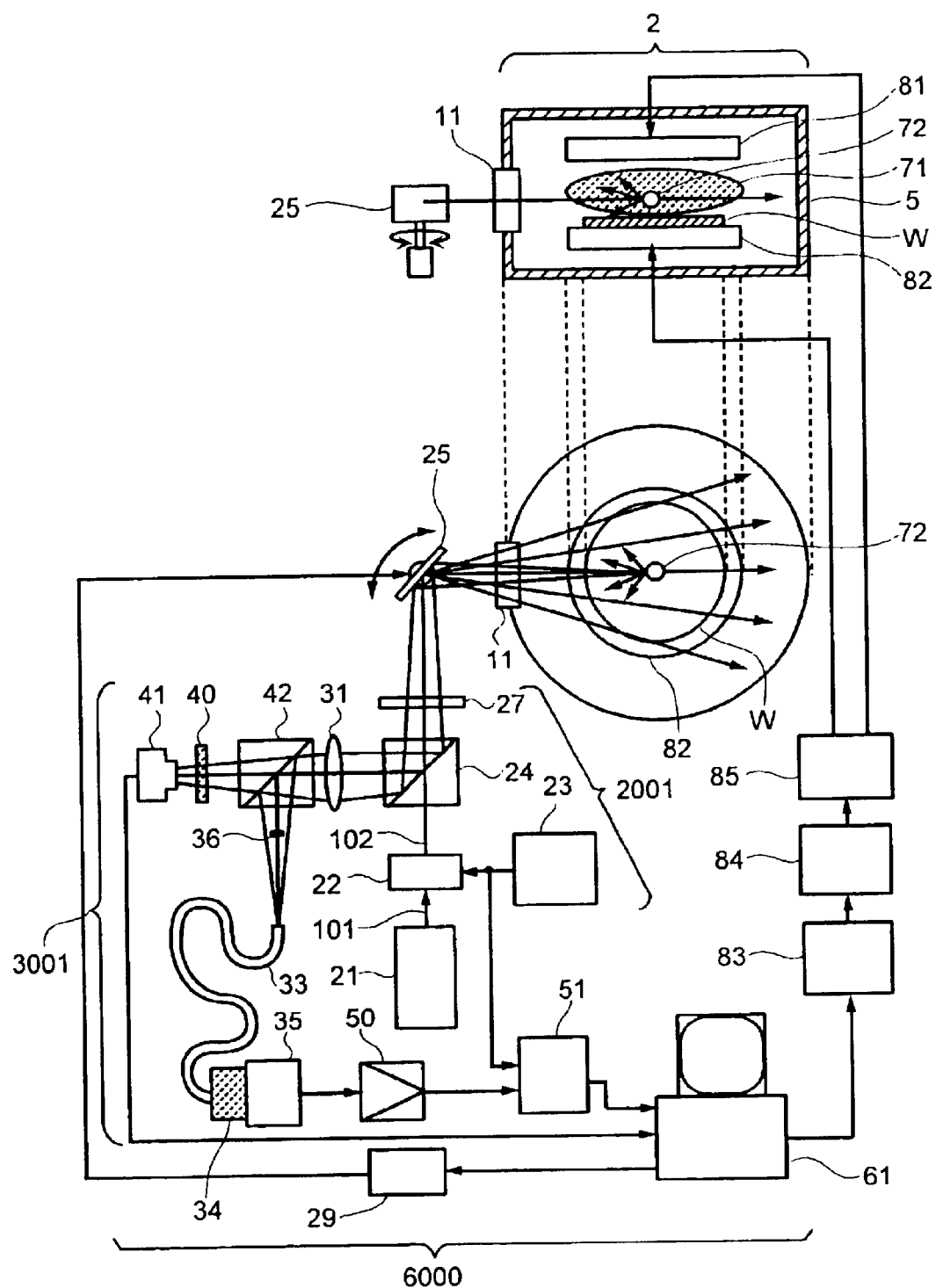
FIG. 9 is a schematic front view of an etching apparatus equipped with a device for measuring fine particles suspended in plasma according to the present invention.
Figure 10:
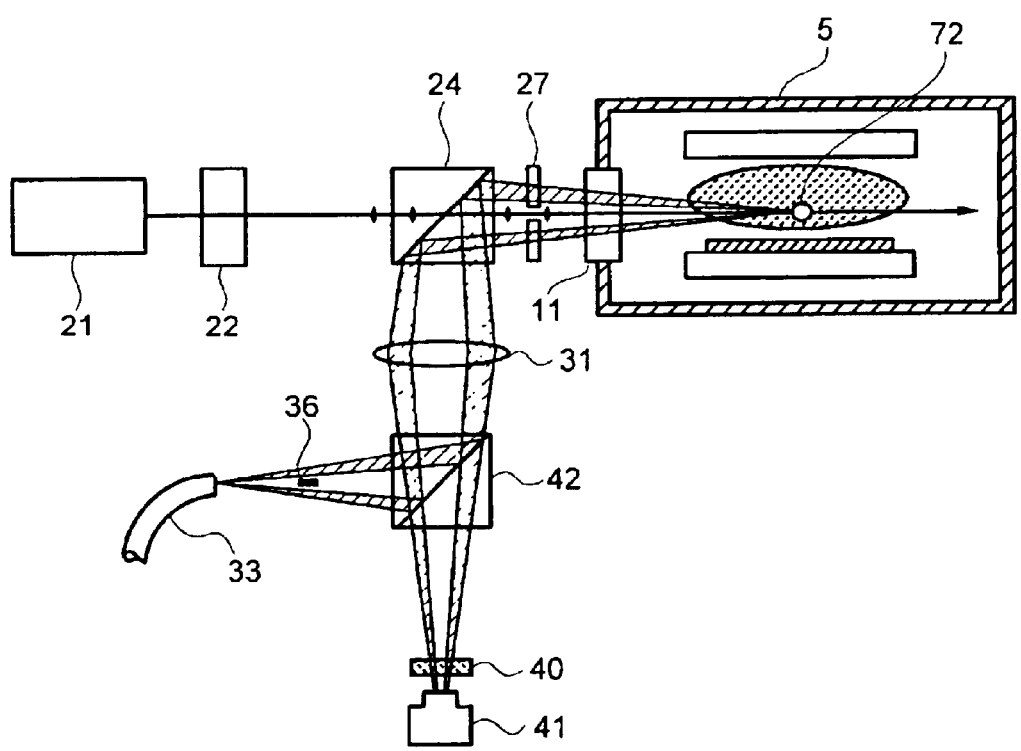
FIG. 10 is a schematic front view of an etching apparatus equipped with an optical system for detecting light scattered by fine particles according to the present invention.

FIG. 9 shows the second embodiment of an etching apparatus 2 equipped with a device for measuring fine particles suspended in a plasma.

The measuring fine particles suspended in a plasma according to this embodiment is set up to be mounted in an etching apparatus that is already equipped with an observation window 11 to allow plasma illumination inspection and the like. This embodiment provides a device for measuring fine particles suspended in a plasma that is effective for cases where there is no Brewster's angle at the observation window, i.e., where a large amount of light is reflected from the surface of the observation window.

In the device for measuring fine particles suspended in a plasma according to this embodiment, the illumination/detection optical system is mounted to the etching apparatus by attaching an element, such as a base plate, near the observation window 11 and then mounting the optical system using the base plate. As in the first embodiment described above, the illumination/optical system is mounted so that it can be moved up and down the base plate to allow fine particle detection to be performed for plasma regions at different heights.

In the first embodiment, P-polarized light was used, and of the back scattered light from fine particles, the S-polarized component perpendicular to the illumination light was detected. However, scattered light generally tends to have strong polarization in the same direction as the entry light. This embodiment implements a structure that extracts the light component that is polarized in the same direction as the entry light. Also, the polarization of the beam entering the observation window is not limited to P-polarization as in the first embodiment.

The plasma processing chamber and the processing method are similar to those used in the first embodiment so that their descriptions will be omitted. Also, modulation/synchronization detection technology similar to that of the first embodiment is used to perform detection by separating the light scattered by the fine particles from the plasma emission in the wavelength and frequency domains, and the light scattered by the inner walls of the plasma processing chamber is blocked by a spatial filter.

The device for measuring fine particles suspended in a plasma according to this embodiment is formed primarily by a laser illumination optical system 2001, a scattered light detection optical system 3001, and a signal processing system 6000. The signal processing system 6000 is similar to that of the first embodiment, so its description will be omitted.

In the second embodiment, the intensity modulated P-polarized beam 102 passes through a polarizing beam splatter 24 and the slits formed on a half-wave plate 27. The light is then guided through the observation window and into the processing chamber 5 by way of the galvano-mirror 25. The direction of the slits on the half-wave plate 27 is indicated in FIG. 10, which is a simplified drawing showing the optical path of the light reflected from the observation window and the manner in which the scattered light is received.

The back-scattered light generated by the fine particle 72 suspended in the plasma 71 passes through the observation window 11 and is directed toward the half wave plate 27 by the galvano-mirror 25. The scattered light, indicated by the shading in FIG. 10, passing through the half-wave plate 27, has its polarization rotated by 90 deg to form S-polarized light. This is then reflected by the polarizing beam splatter 24 and detected by the scattered light detection optical system. The light directly reflected from the front surface and back surface of the observation window 11 passes through the slits of the half-wave plate 27 so that it remains P-polarized and is reflected by the polarizing beam splitter, thus preventing it from being detected by the scattered light detection optical system.

On the laser entry side, the observation window 11 is coated with a reflection preventing coating to minimize reflections for the wavelength, the polarization, and the entry angle of the entry beam. This allows the reflected light to be reduced. The receiving and imaging of the scattered light is the same as in the first embodiment, so the corresponding description will be omitted.

The computer 61 is equipped with a terminal for outputting obtained information to the plasma processing apparatus and an input terminal for obtaining operation information, such as accumulated discharge time, from the plasma processing apparatus. As in the first embodiment, the plasma processing apparatus is monitored and controlled based on the information obtained from the apparatus for measuring fine particles suspended in plasma.

In addition to the advantages provided by the first embodiment, this embodiment allows light scattered by fine particles to be detected even if the observation window does not have a special structure and generates reflected light. Also, the present invention allows detection of light scattered by fine particles having the same polarization direction as the illumination light, and the back-scattered light signal from the fine particles can be detected more effectively.

A third embodiment of the present invention will be described with reference to FIG. 11 and FIG. 12.

Figure 11:
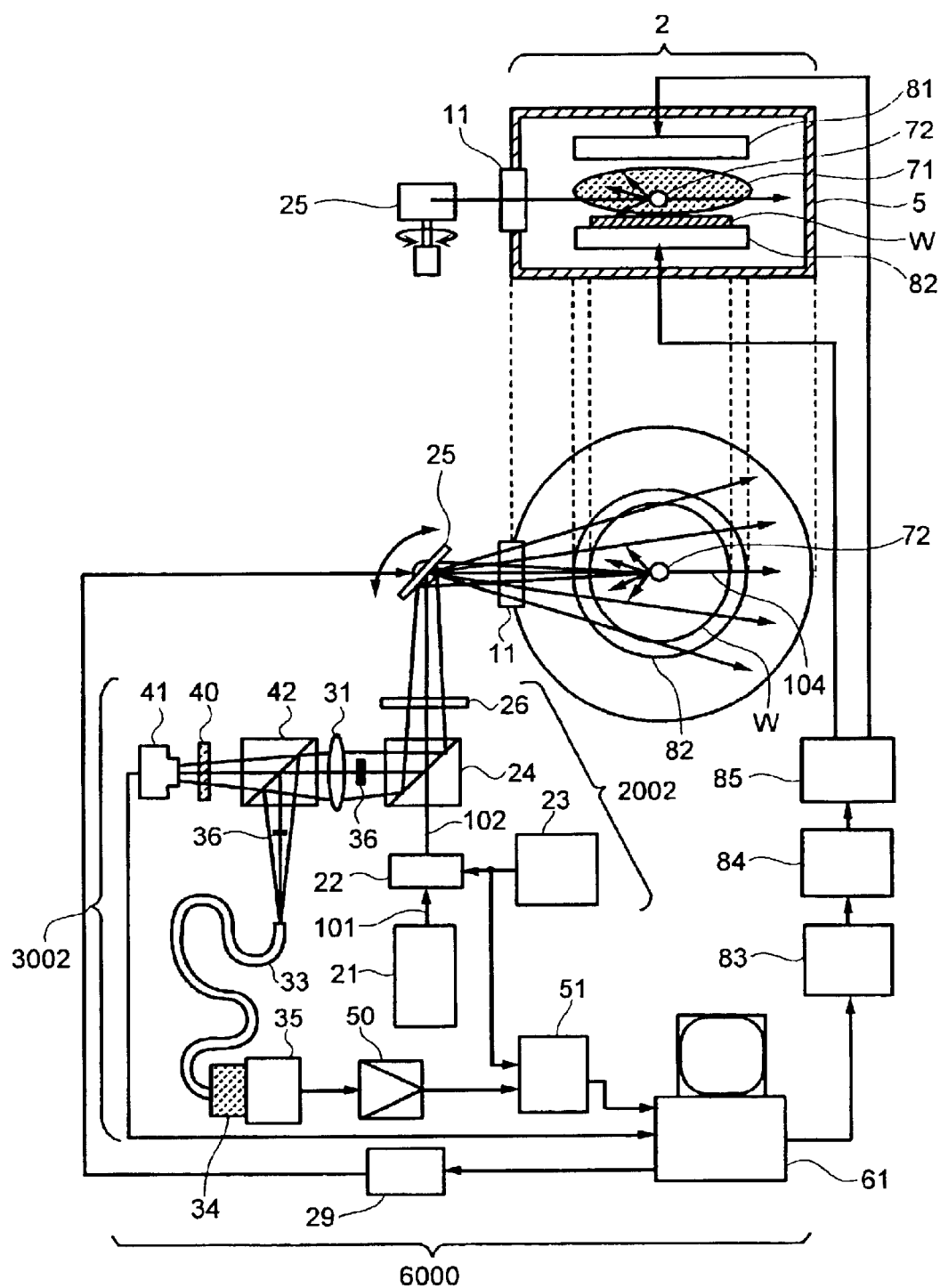
FIG. 11 is a schematic front view of an etching apparatus equipped with a device for measuring fine particles suspended in plasma according to the present invention.

FIG. 11 shows an etching apparatus 2 equipped with a device for measuring fine particles suspended in a plasma according to the third embodiment.

As in the second embodiment, the device for measuring fine particles suspended in a plasma is designed to be mounted on an etching apparatus that is already equipped with an observation window 11 to allow observation of plasma emission and the like. This embodiment provides an device for measuring fine particles suspended in a plasma that is effective even when the observation window is not provided with special structures, such as a Brewster's angle, i.e., when light reflected from the surface of the observation window is present.

As in the second embodiment, the illumination/detection optical system of the device for measuring fine particles suspended in plasma according to this embodiment is mounted on the etching apparatus by attaching an element, such as a base plate, to the observation window 11 and mounting the system by way of this base plate. As in the first embodiment, the illumination/detection optical system is mounted so that it can be moved up and down on the base plate, thus allowing fine particles to be detected in plasma regions of different heights.

What makes this embodiment different from the second embodiment is the use of circularly polarized light illumination and circularly polarized light detection.

The plasma processing chamber and processing method are the same as in the first embodiment, so their descriptions will be omitted. Also, as in the first embodiment, modulation/synchronization technology is used to separate the light back-scattered by the fine particles from the plasma illumination over the wavelength and frequency domains to perform detection, and light scattered by the inner walls of the processing chamber is blocked by a spatial filter.

The device for measuring fine particles suspended in a plasma according to this embodiment is formed essentially from a laser illumination optical system 2002, a scattered light detection optical system 3002, and a signal processing system 6000. The signal processing system 6000 is the same as in the first embodiment, so its description will be omitted.

The P-polarized beam 102 is intensity modulated as in the first and second embodiments and is passed through the polarizing beam splitter 24. It is then turned into a circularly polarized beam 104 by a quarter-wave plate 26, which is then guided through the observation window 11 into the processing chamber 5 by way of the galvano-mirror 25.

Figure 12:
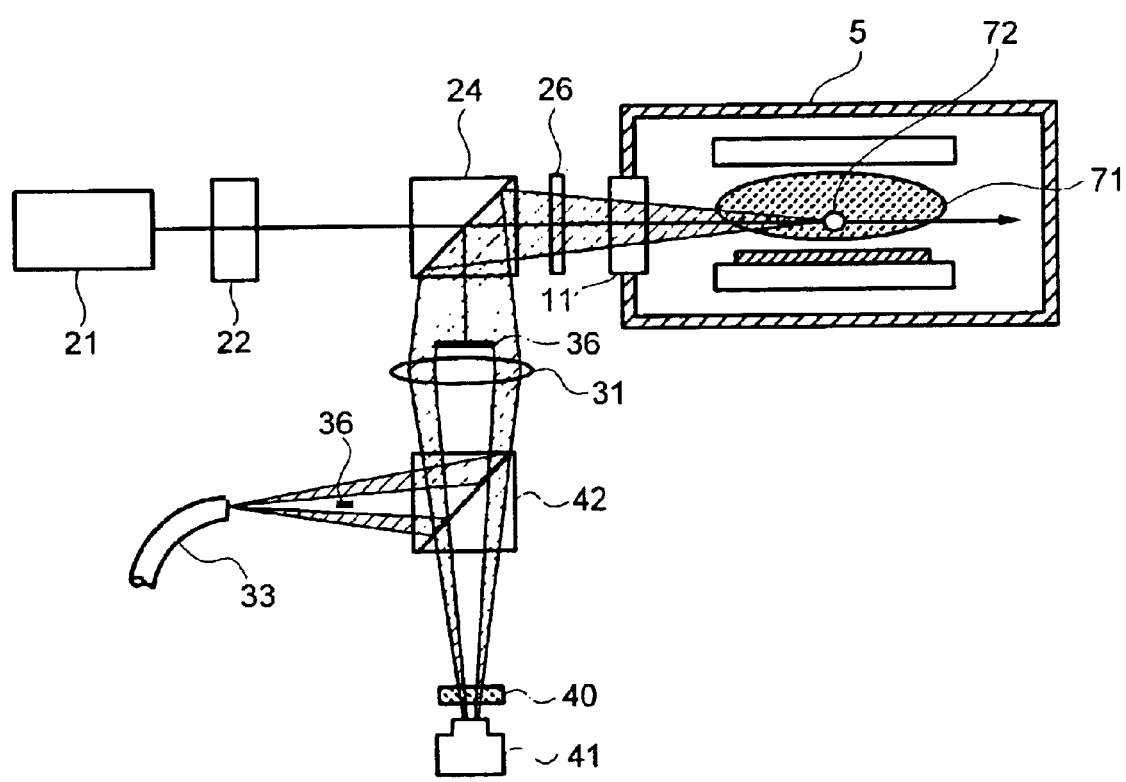
FIG. 12 is a schematic front view of an etching apparatus equipped with an optical system for detecting light scattered by fine particles according to the present invention.

FIG. 12 is a simplified diagram showing the optical path of the light reflected from the observation window and the reception of scattered light.

As FIG. 11 and FIG. 12 show, the back scattered light generated by the fine particles 72 suspended in the plasma 71 passes through the observation window 11 and is directed to the quarter-wave plate 26 by the galvano-mirror. The scattered light passing through the quarter-wave plate 26 again has its polarization rotated by 90 deg to form S-polarized light, causing it to be reflected by the polarizing beam splitter 24 and detected by the scattered light detection optical system. The light directly reflected from the front surface and back surface of the observation window also passes through the quarter-wave plate 26 to form S-polarized light, which is then reflected by the polarizing beam splatter 24 and goes to the scattered light detection optical system. A spatial filter 36 is disposed in front of or behind the imaging lens 31 to block the light reflected from the observation window.

As in the first and the second embodiments, a reflection-preventing coating 15 is applied to the laser entry side of the observation window 11 so that reflection is minimized for the wavelength and entry angle of the entry beam. This allows the reflected light to be reduced.

In this manner, this embodiment allows circularly polarized light illumination and circularly polarized light detection to be used in a device for measuring fine particles suspended in a plasma similar to the one in the second embodiment.

As in the second embodiment, this embodiment can be equipped with a terminal for outputting information obtained by the signal processing system to the plasma processing apparatus and an input terminal for obtaining operation information from the plasma processing apparatus such as accumulated discharge time. This allows the plasma processing apparatus to be monitored and controlled by the device for measuring fine particles suspended in a plasma.

Thus, as in the second embodiment, this embodiment allows light scattered by fine particles to be detected through circularly polarized illumination and circularly polarized detection without being influenced by reflected light generated by an observation window that is not equipped with special structures.

Also, this embodiment uses circularly polarized illumination and circularly polarized detection so that the light scattered by fine particles can be detected more efficiently than in the first embodiment.

A fourth embodiment of the present invention will be described with reference to FIG. 13 and FIG. 14.

Figure 13:
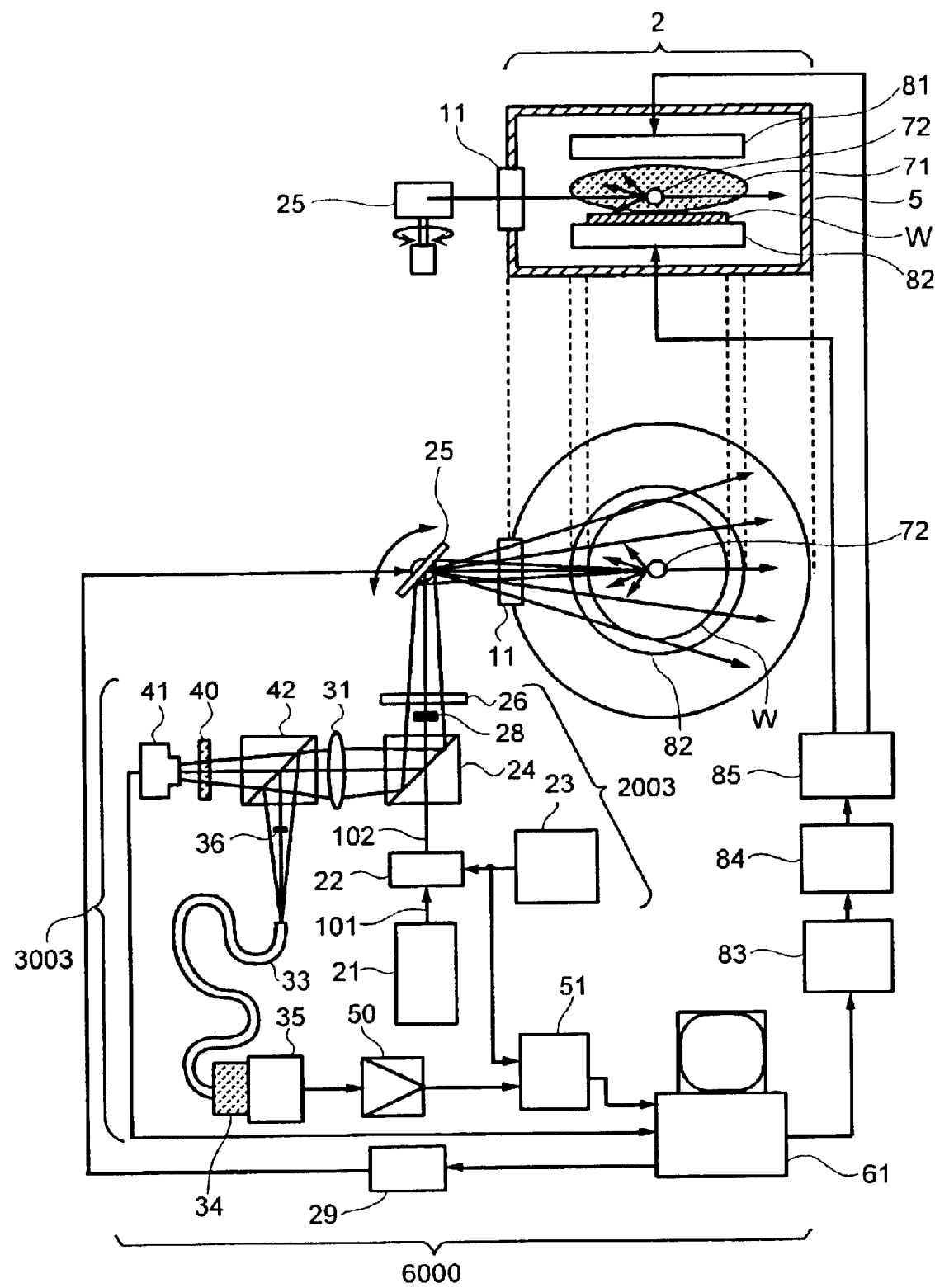
FIG. 13 is a schematic front view of an etching apparatus equipped with an apparatus for measuring fine particles suspended in plasma according to the present invention.

FIG. 13 shows an etching apparatus equipped with a device for measuring fine particles suspended in a plasma according to the fourth embodiment. The device for measuring fine particles suspended in a plasma according to this embodiment is formed essentially from a laser illumination optical system 2003, a scattered light detection optical system 3003, and a signal processing system 6000.

The difference between this embodiment and the third embodiment is that in the third embodiment a spatial filter is used to block light reflected from the- observation window. In this embodiment, a linear polarization plate is used to block light. This embodiment provides exactly the same advantages as those of the third embodiment, so only the aspects that are different from the third embodiment will be described.

A P-polarized beam that is intensity modulated as in the third embodiment is passed through the polarizing beam splitter 24 and then passes through a linear polarization plate 28 disposed so that the P-polarized light passes through it. The quarter-wave plate 26 turns the light into circularly polarized light, which is then passed through the observation window 11 and guided into the processing chamber 5 by way of the galvano-mirror 25.

Figure 14:
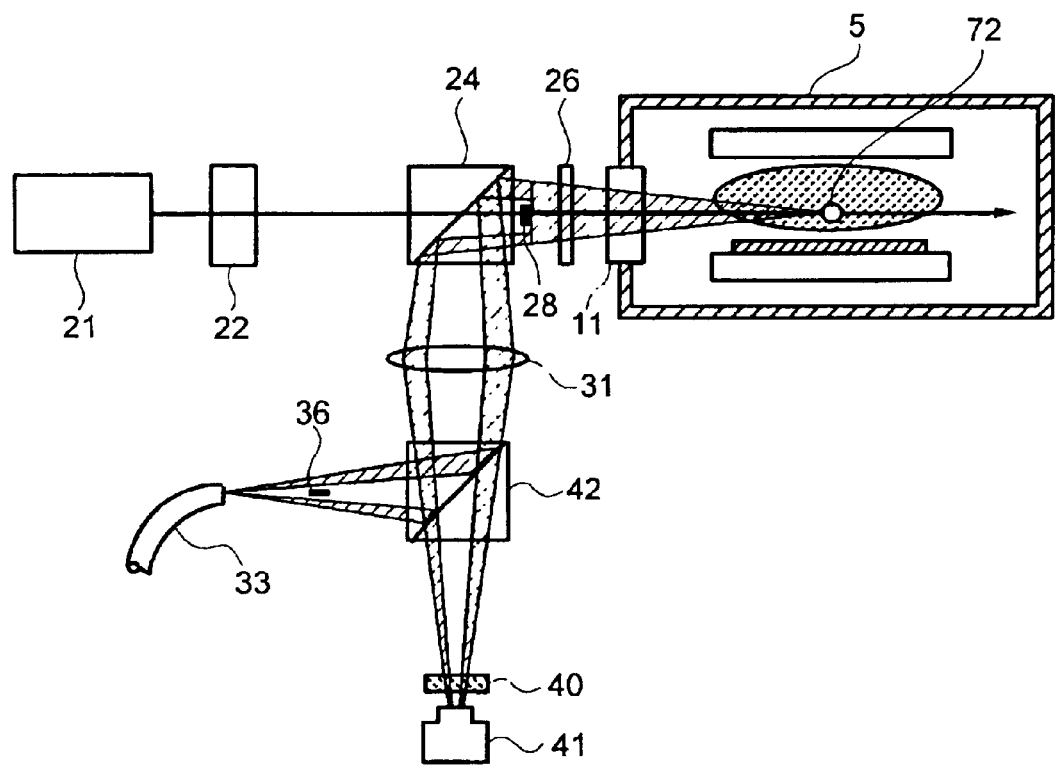
FIG. 14 is a schematic front view of an etching apparatus equipped with an optical system for detecting light scattered by fine particles according to the present invention.

FIG. 14 shows a simplified representation of the optical path of the light reflected from the observation window and the reception of the scattered light.

As shown in FIG. 13 and FIG. 14, the back-scattered light generated by the fine particles 72 suspended in the plasma 71 passes through the observation window 11 and is directed toward the quarter-wave plate 26 by the galvano-mirror. The scattered light passing through the quarter-wave plate 26 has its polarization rotated by 90 deg to form S-polarized light which, apart from the slight region blocked by the linear polarization plate 28, is reflected by the polarizing beam splitter 24 and is detected by the scattered light detection optical system.

The light directly reflected from the front surface and back surface of the observation window 11 passes through the quarter-wave plate 26 to form S polarized light, which is blocked by the linear polarization plate 28. Thus, as in the third embodiment, this embodiment does not detect light reflected from the observation window.

As in the second and the third embodiments, this embodiment can be equipped with a terminal for outputting information obtained with the signal processing system to the plasma processing apparatus and the like and an input terminal for obtaining operation information from the plasma processing apparatus such as accumulated discharge time. This allows the apparatus for measuring fine particles suspended in plasma to monitor and control the plasma processing device. Thus, as in the second and the third embodiments, this embodiment can detect back-scattered light from fine particles without being influenced by light reflected from an observation window not equipped with special structures.

Also, this embodiment uses circularly polarized illumination and circularly polarized detection. This allows back-scattered light generated by fine particles to be detected more effectively compared to the first embodiment.

The following, with references to FIG. 15 through FIG. 23, FIG. 29(a), FIG. 29(b), and FIG. 30, is a description of a detection method and apparatus that takes into consideration the influence of light reflected from the inner walls of the processing chamber when laser light illumination is used.

Figure 15:
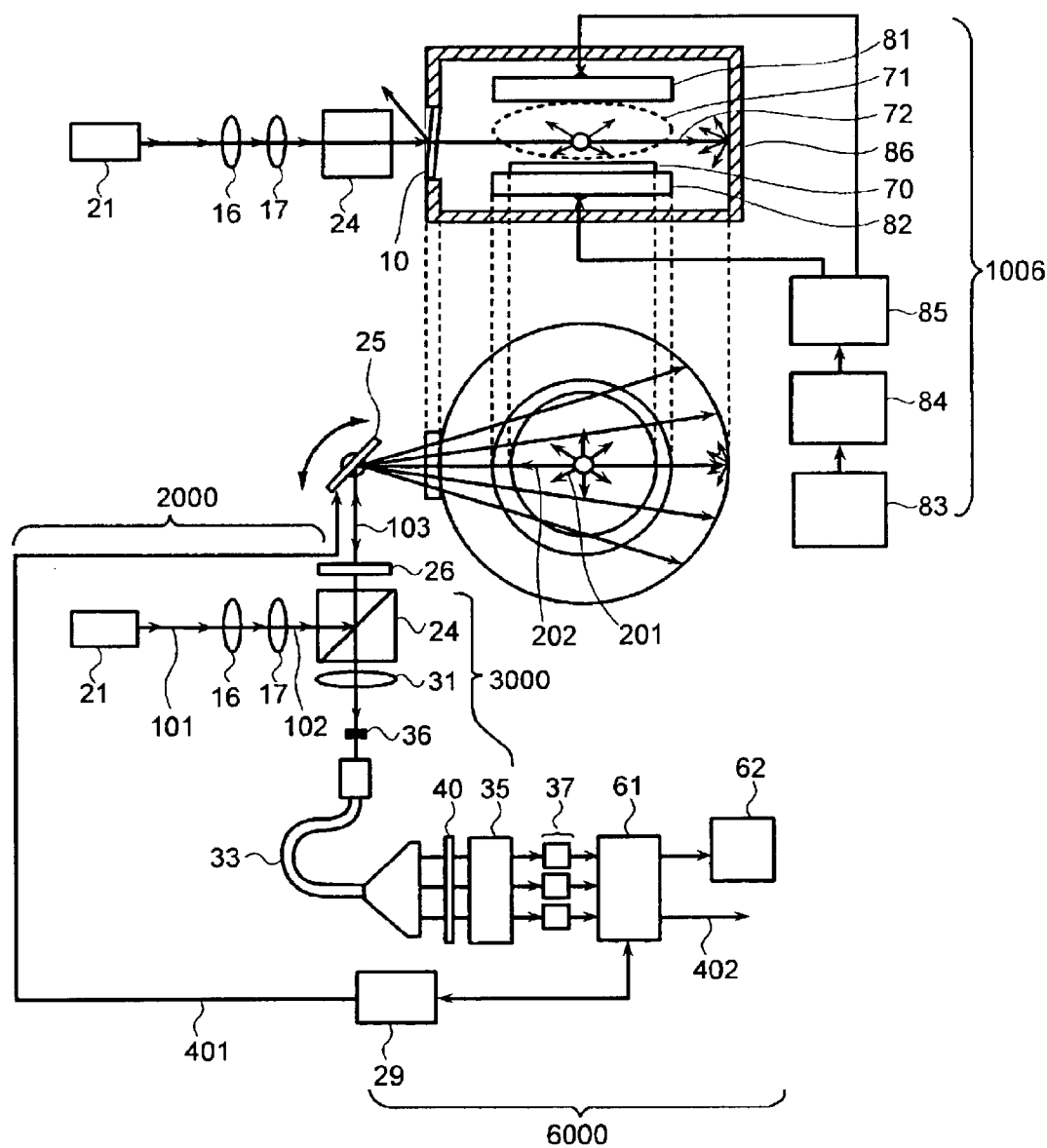
FIG. 15 is a schematic front view of an etching apparatus equipped with apparatus for measuring fine particles suspended in plasma according to the present invention.

FIG. 15 shows an etching apparatus 1006 and a device for measuring fine particles suspended in a plasma according to the fifth embodiment. The apparatus for measuring fine particles suspended in a plasma is formed essentially from a laser illumination optical system 2000, a scattered light detection optical system 3000, and a signal processing/control system 6000.

As shown in FIG. 15, the etching apparatus 1006 uses a high frequency signal from the signal generator 83 to modulate the output potential of a power amp 84. This high-frequency potential is split up into two components by the distributor 85 and the respective components are applied to the upper electrode 81 and the lower electrode 82, which are disposed in parallel to each other in the plasma processing chamber 86. Discharge between the electrodes generates the plasma 71 from etching gas, and this results in the etching of a semiconductor substrate W, which is the item being processed.

The high-frequency signal is a signal with a frequency of, for example, 400 kHz. In the etching operation, the progress of etching is monitored and the timing at which to stop etching is detected as accurately as possible so that etching is performed for a predetermined pattern and depth only. When the stopping timing is detected, the output from the power amp 83 is stopped and the semiconductor wafer 70 is ejected from the plasma processing chamber.

Figure 18:
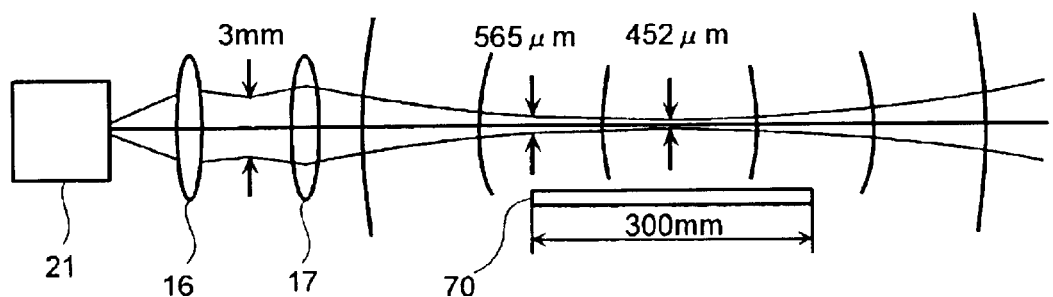
FIG. 18 is a schematic front view of an etching apparatus equipped with an optical system for detecting light scattered by fine particles and a beam spot size over a wafer generated by a focus beam through a spherical lens.

In the laser illumination optical system 2000, the S-polarized beam 101 emitted from the laser light source 21 (e.g., a YAG secondary harmonic laser with a wavelength of 532 nm) is expanded by a collimating lens 16 and then focused at the center of the semiconductor wafer 70 using the focusing lens 17. For example, if the entry aperture into the focusing lens 17 is 3 mm and the focal distance of the focusing lens 17 is 2000 mm, as shown in FIG. 18, well-known geometrical optical formulas indicate that a focused beam having a focal depth of 602 mm will provide a beam spot diameter of 452 microns at the center of a wafer with a 300 mm diameter, with the beam spot diameters at the front and back being 565 microns. This allows fine particles on a wafer with a 300 mm diameter to be illuminated with a roughly uniform optical energy density.

The focused S-polarized beam 102 is reflected by the polarizing beam splitter 24 and then passes through the quarter-wave plate 26 to be converted into the circularly polarized beam 103. Then, the beam is reflected by the galvano-mirror 25, which is operated at a high speed, and passes through the observation window 10 to enter into the plasma processing chamber 87, where it scans the entire surface over the semiconductor wafer 70. By scanning the beam with a long focal depth, as described above, the entire surface over the semiconductor wafer 70 can be illuminated with a roughly uniform energy density. The circularly polarized beam 103 is scattered by the fine particles 72 suspended in the plasma 71.

Out of the scattered light 201 generated by fine particles, back-scattered light 202 scattered backward along the same optical axis as the entry beam is reflected by the galvano-mirror 25. The circularly polarized light component thereof, which is the regular reflection component, passes through the quarter-wave plate 26 again and is converted into P-polarized light, which then passes-through the polarizing beam splitter 24 and is focused at the entry end plane of the optical fiber 33 by the imaging lens 31.

Figure 16:
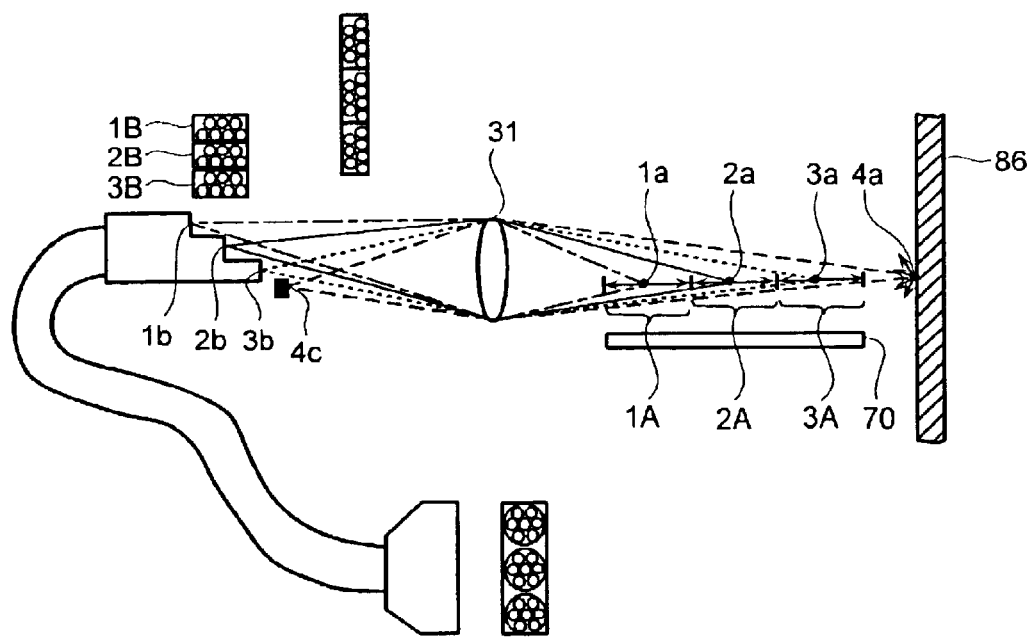
FIG. 16 is a schematic front view of an etching apparatus equipped with an optical system for detecting light scattered by fine particles according to the present invention.

As shown in FIG. 16, the imaging lens 31 is offset from the chief ray of the optical propagation axis of the back-scattered light. As a result, the back-scattered light generated by fine particles at a front 1a, a center 2a, and a rear 3a, will not be imaged along the same optical axis and will instead be imaged at different positions 1b, 2b, 3b. The light-receiving end plane of the fiber bundle 33 is formed with a staircase shape corresponding to the imaging points 1b, 2b, 3b, so that the distinct points 1a, 2a, 3a above the wafer 70 along the optical axis of the illumination light can be distinguished using the light scattered by the fine particles.

The size of a light-receiving surface b1 of the multi-level fiber bundle 33 is set to have an area that will still allow detection of defocused back-scattered light generated by a fine particle from the region 1A around the wafer point 1a. Similarly, the sizes of light-receiving surfaces b2, b3 of the multi-level fiber bundle 33 is set to have areas that will still allow detection of defocused back-scattered light generated by a fine particle from the region 2A, 3A around the wafer points 2a, 3a, respectively. Thus, with high-speed scanning of a long focus beam, fine particles over the entire surface of the semiconductor wafer 70 can be detected, and the regions in which fine particles are generated can be placed in three distinct regions along the optical axis.

If, as in this embodiment, the laser wavelength is 532 nm, and the diameter of a fine particle is less than approximately 10 microns, almost all of the polarized component of the back-scattered light will be the same as the polarized component of the entry light. Thus, with the widely known method for polarized separation that uses S-polarized illumination and P-circularly polarized detection (P-polarized illumination/S-polarized detection), the detected scattering intensity is significantly reduced, leading to lower detection sensitivity. This embodiment uses circularly polarized illumination detection sensitivity. This embodiment uses circularly polarized light detection to restrict the reduction of detection sensitivity accompanying smaller fine particle diameters. Scattered light and directly reflected light from an illumination point 4a of the processing chamber wall 86 will not be detected since the detection optical axis is shifted so that imaging takes place at a point 4b outside of the light-receiving plane of the multi-level fiber bundle 33.

Figure 17:
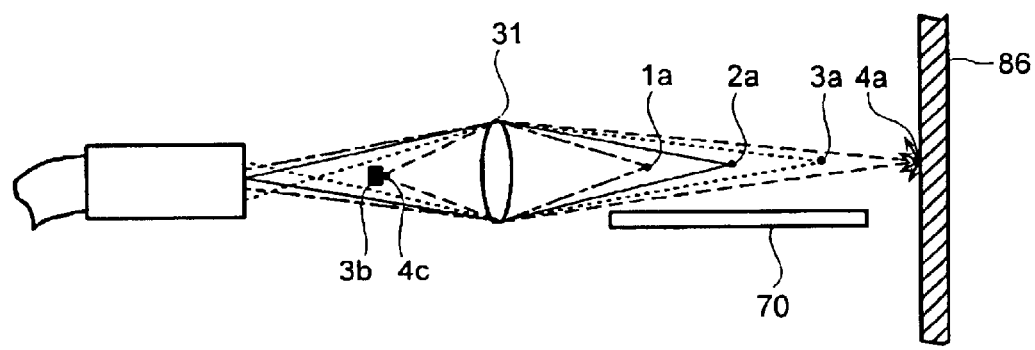
FIG. 17 is a schematic front view of an etching apparatus equipped with an optical system for detecting light scattered by fine particles and received by an imaging optical system and a fiber bundle.

This is another aspect of the present invention. If the detection optical axis is not shifted, as shown in FIG. 17, an imaging point 4c of scattered light or directly reflected light from the illumination point 4a of the processing chamber wall 86 will be positioned within the light beam of the back-scattered light generated by the fine particles from the position 1a and the like over the semiconductor wafer 70 being detected. If the spatial filter 36 or the like is used to block the scattered light and the directly reflected light from the illumination point 4a of the processing chamber wall 86, a portion of the back-scattered light generated by the fine particles will also be blocked, thus reducing the detection sensitivity. However, with the detection optical axis shifted as in the present invention, the detection sensitivity will not be reduced. The directly reflected light from the fine particle observation window 10 is prevented from entering the optical fiber by tilting the observation window 10 so that the reflected light axis is shifted from the detection optical axis. This is another aspect of the present invention.

Also, a reflection preventing coating can be applied to the observation window in order to reduce the intensity of the reflected light. The exit end of the fiber 33 corresponds to the light-receiving end plane of the multi-level fiber bundle 33 and is split up in a similar way. The exit end of the multi-level fiber bundle 33 is connected to an interference filter 40 so that the component having the same wavelength (532 nm) as the laser light is extracted. A three-channel one-dimensional sensor 37 distinguishes the detection lights from the different exit end planes and converts the light into electrical signals. This allows identification of regions generating fine particles as one of three distinct regions along the illumination light axis.

Figure 30:
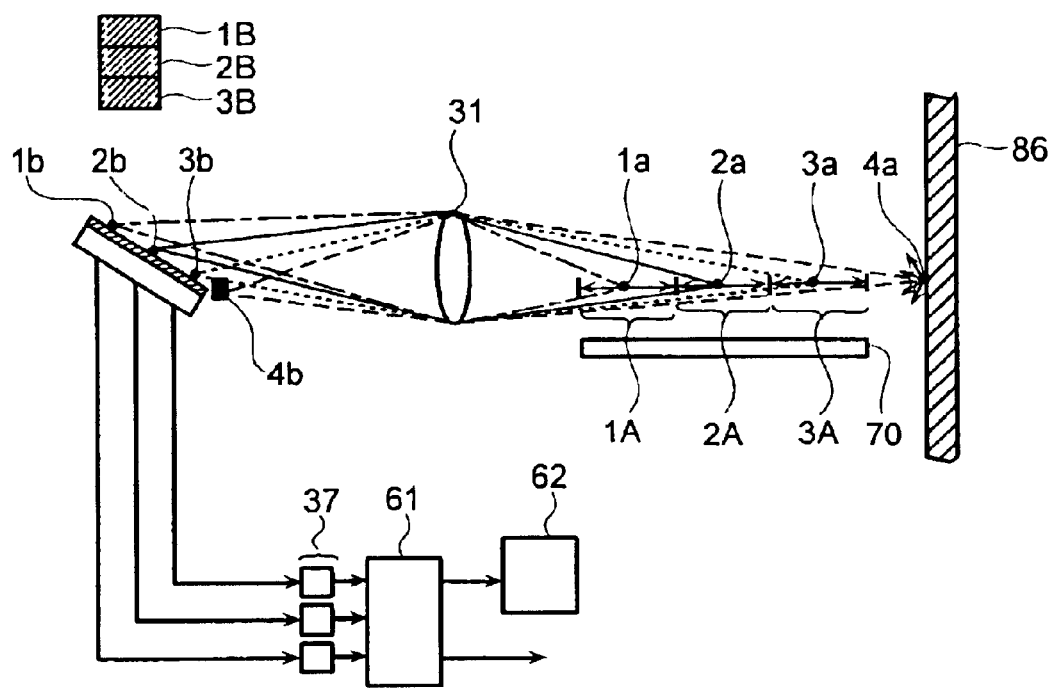
FIG. 30 is a schematic front view of an etching apparatus equipped with an optical system for detecting light scattered by fine particles with an axially offset detection optical system and a three-channel one-dimensional sensor according to the present invention.

In place of the three-channel one-dimensional sensor 37, a three-channel parallel output photodiode array can be used. Also, as shown in FIGS. 29(a), 29(b) and FIG. 30, instead of receiving light through a multi-level fiber bundle, the light which has passed through the interference filter 40 can be directly received by the three-channel one-dimensional sensor 37 or the three-channel parallel output photodiode array. The detection signals from the channels in the three-channel one-dimensional sensor are amplified by a three-channel amplifier unit 37 in the signal processing/control system 6000 and then sent to the computer 61. The computer 61 sends a scan control signal 401 to the galvano-mirror 25 by way of the galvano driver 29. As the beam 103 is scanned, the intensity of back-scattering from fine particles is displayed on the display 62.

Figure 19:
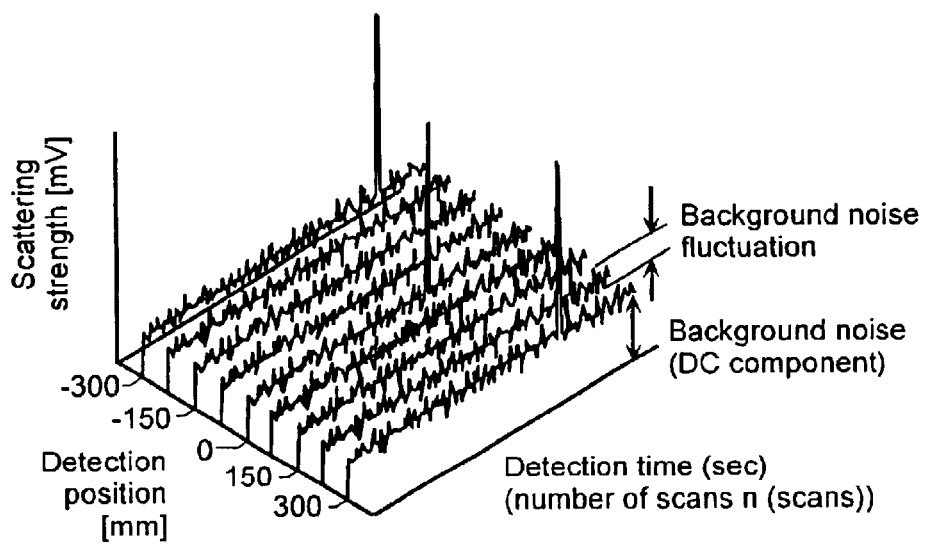
FIG. 19 is a three-dimensional graph which shows a distribution of the detected light intensities of nine points on a wafer according to the present invention.
Figure 20:
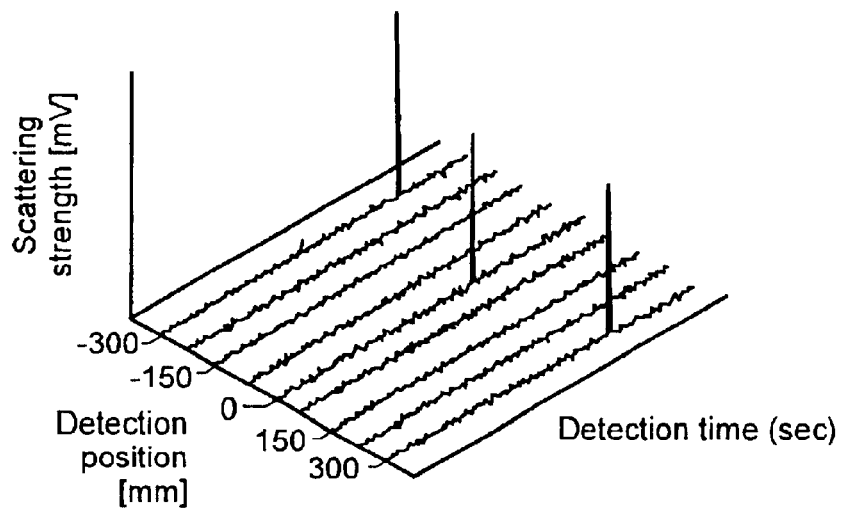
FIG. 20 is a three-dimensional graph which shows a distribution of the detected light intensities of nine points on a wafer according to the present invention.
Figure 21:
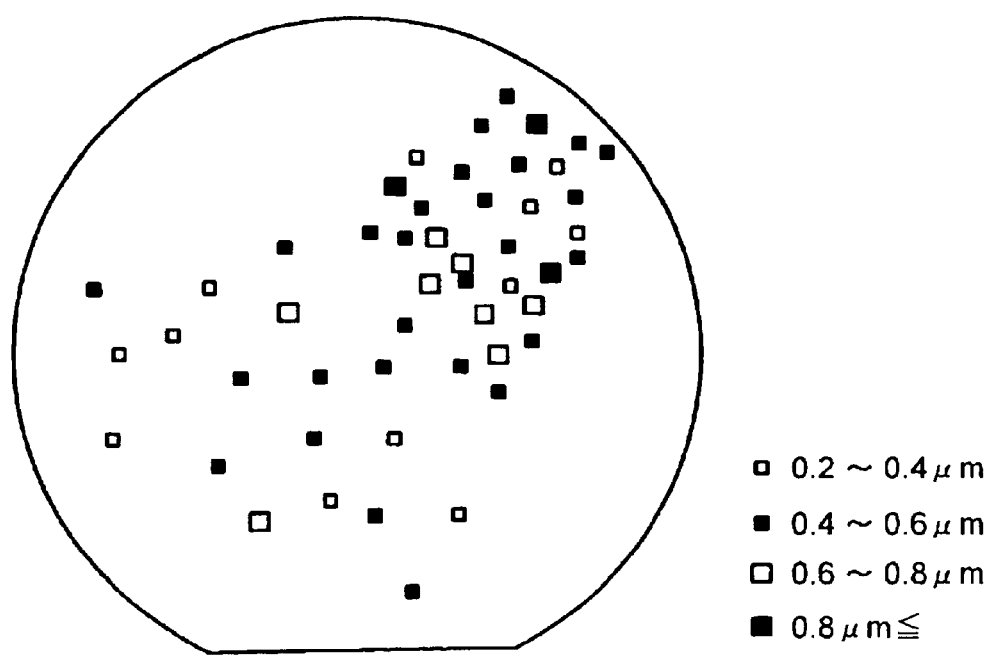
FIG. 21 is a diagram which shows an example of the distribution of fine particles by size over the entire surface of a wafer according to the present invention.

FIG. 19 through FIG. 21 show examples of what is displayed on the display 62. FIG. 19 shows variations over individual scans, i.e., variations over time, of the detection signal at the central region of the wafer from the illumination light 9 line on a wafer having a diameter of 300 mm. When scattered light is generated by a fine particle suspended in the plasma, a strong pulse signal appears, as shown at three positions in FIG. 3(a). The size of the fine particles can be evaluated using the intensity of these pulse signals.

As shown in FIG. 20, the DC component of the background noise at each detection position and fluctuations in background noise that consistently fluctuate in the same way can be canceled out by taking the difference in output between the n-th scan and the (n−1)-th scan. This makes evaluation of the fine particle signal easier. The measurement operation is finished when etching is completed and the wafer 70 is ejected from the processing chamber. The measurement data is recorded for each wafer. The measurement data can be sent out, and the contamination status in the processing chamber plasma processing chamber 87 can be continuously monitored using the external output signal 402.

In this embodiment, the multi-level fiber bundle is formed from three levels. However, the number of levels is not restricted to three and can be selected to be any number that is two or more. The position resolution along the optical axis is provided by three levels in this embodiment, which will be 100 mm for a wafer having a diameter of 300 mm. It would also be possible to improve the position resolution along the optical axis by increasing the number of levels. For example, by using ten levels in the fiber bundle and ten channels for signal processing, a resolution of 30 mm can be provided.

As FIG. 21 shows, by increasing the number of levels and improving position resolution along the optical axis, position data of the scanning illumination beam and data regarding positions along the illumination optical axis at which fine particles are generated can be used to determine positions at which fine particles are generated. Also, signal intensities can be used to evaluate the sizes of fine particles and to map the distribution of fine particles on the wafer with the sizes of the fine particles. The fine particle mapping data from each scan can be used to estimate the behavior of the fine particles. This can provide information used to determine the positions in the processing chamber at which fine particles are generated. Furthermore, this information can be used to find a way to reduce fine particles in the processing chamber.

Figure 22:
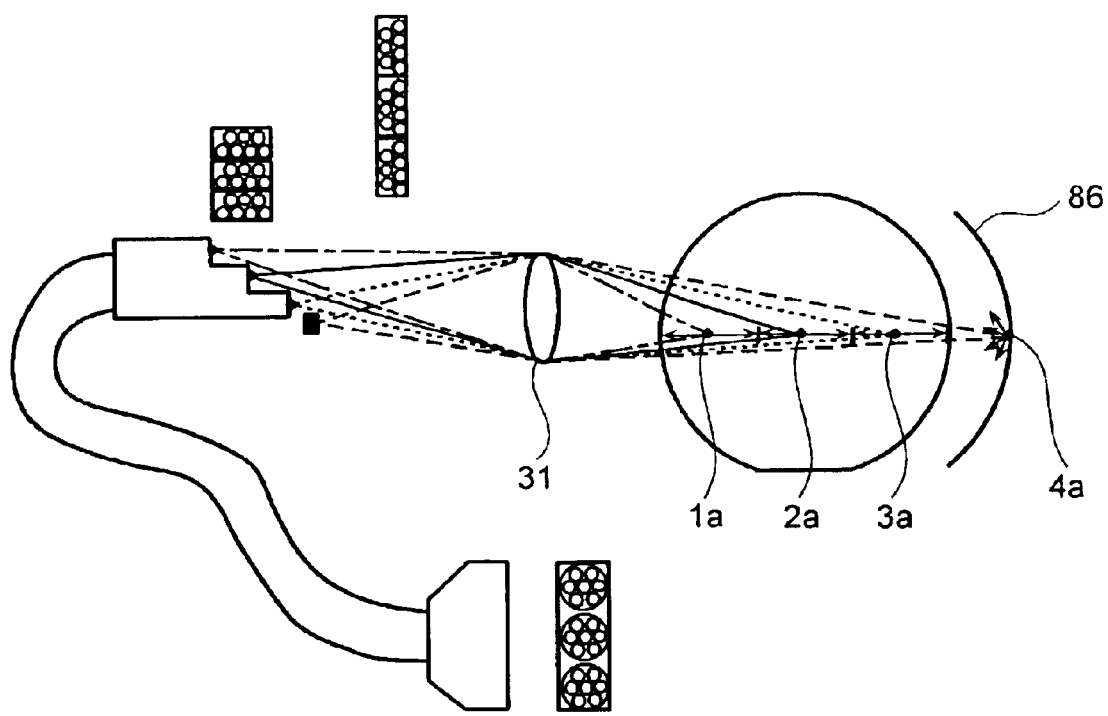
FIG. 22 is a schematic front view of an etching apparatus equipped with an optical system for detecting light scattered by fine particles with a multilevel fiber bundle according to the present invention.

Of course, the number of bundles in the fiber bundle 33 and the shape of the bundles are not restricted to those shown in FIG. 16. Any shape and any number can be used. Furthermore, as shown in FIG. 16, this embodiment is formed so that the imaging lens 31 is shifted upward relative to the wafer. Of course, it would also be possible to shift the imaging lens downward. Furthermore, as can be seen from the fact that the same advantages can be provided when the imaging lens 31 is shifted along a direction parallel to the wafer surface, as shown in FIG. 22, the shifting of the axis of the imaging lens 31 can be performed in any direction. Also, tilting the imaging lens can provide the same advantages as shifting its axis.

Figure 23:
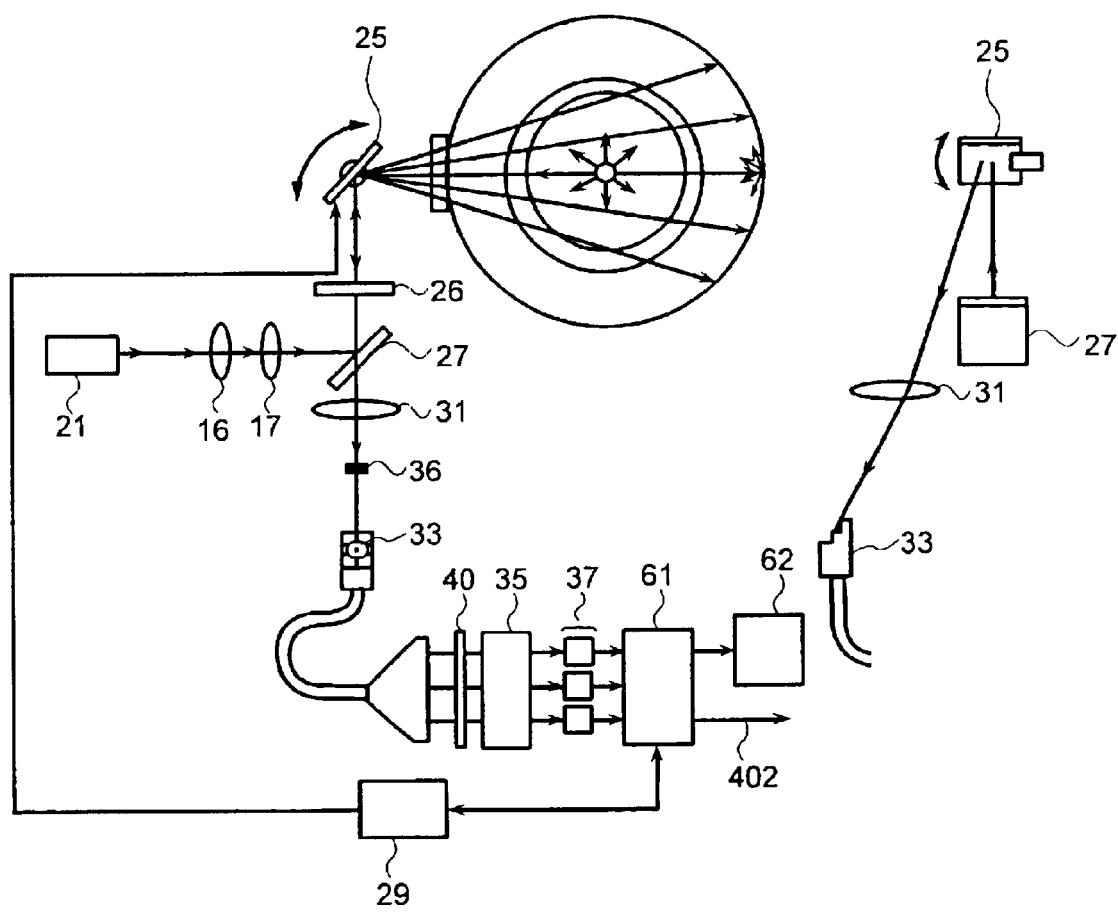
FIG. 23 is a schematic front view of an etching apparatus equipped with an axially offset detection optical system and a multi-level bundle when an illumination optical system and a detection optical system are separated according to the present invention.

Furthermore, this embodiment performs back-scattered light detection so that illumination and back-scattered light detection can be performed through a single observation window. Thus, the illumination optical system and the detection optical system can be formed as a single unit with a compact optical system. This is one aspect of the present invention. Conversely, by offsetting the illumination optical axis and the detection optical axis, the illumination optical system and the scattered light detection optical system can be formed separately, as shown in FIG. 23.

According to the present invention, the use of long focus beam scanning, an imaging optical system with axis shifting, and a multi-level fiber bundle provides roughly uniform energy illumination and detection sensitivity over the entire surface of the wafer. Furthermore, the positions at which fine particles are generated on the entire surface of the wafer can be determined.

This allows real-time monitoring of the contamination status in the etching apparatus processing chamber, thus reducing defective wafers caused by adhered contaminants and allowing the timing at which to clean the apparatus to be accurately known. Also, the frequency of pre-checking operations using dummy wafers can be reduced, thus reducing costs and improving productivity. Furthermore, since the positions at which fine particles are generated can be determined, the behavior of fine particles can be estimated, thus allowing the source of fine particle generation to be determined. This can provide information that is effective in reducing fine particles.

Figure 24:
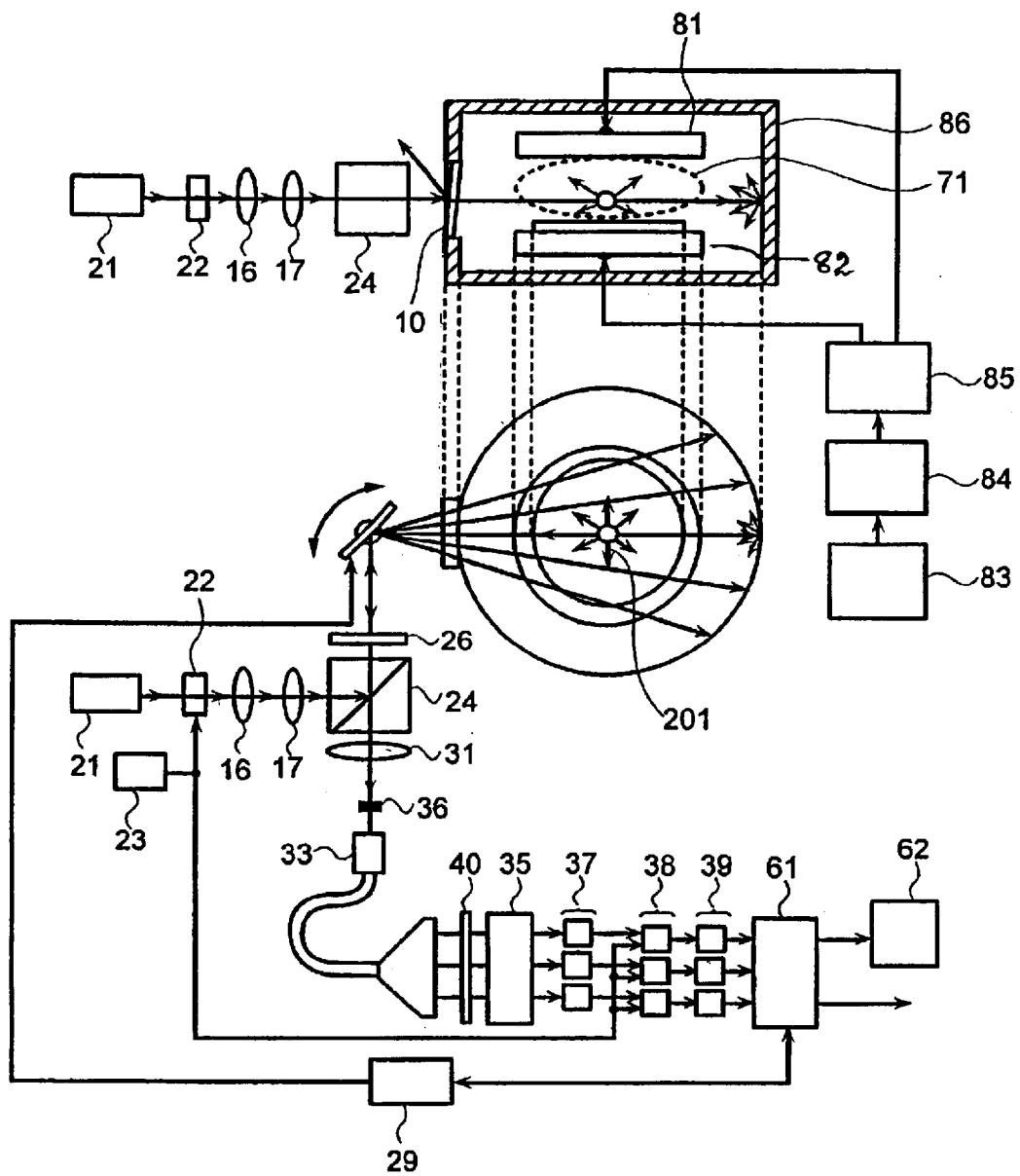
FIG. 24 is a schematic front view of an etching apparatus equipped with an apparatus for measuring fine particles suspended in plasma according to the present invention.
Figure 25:
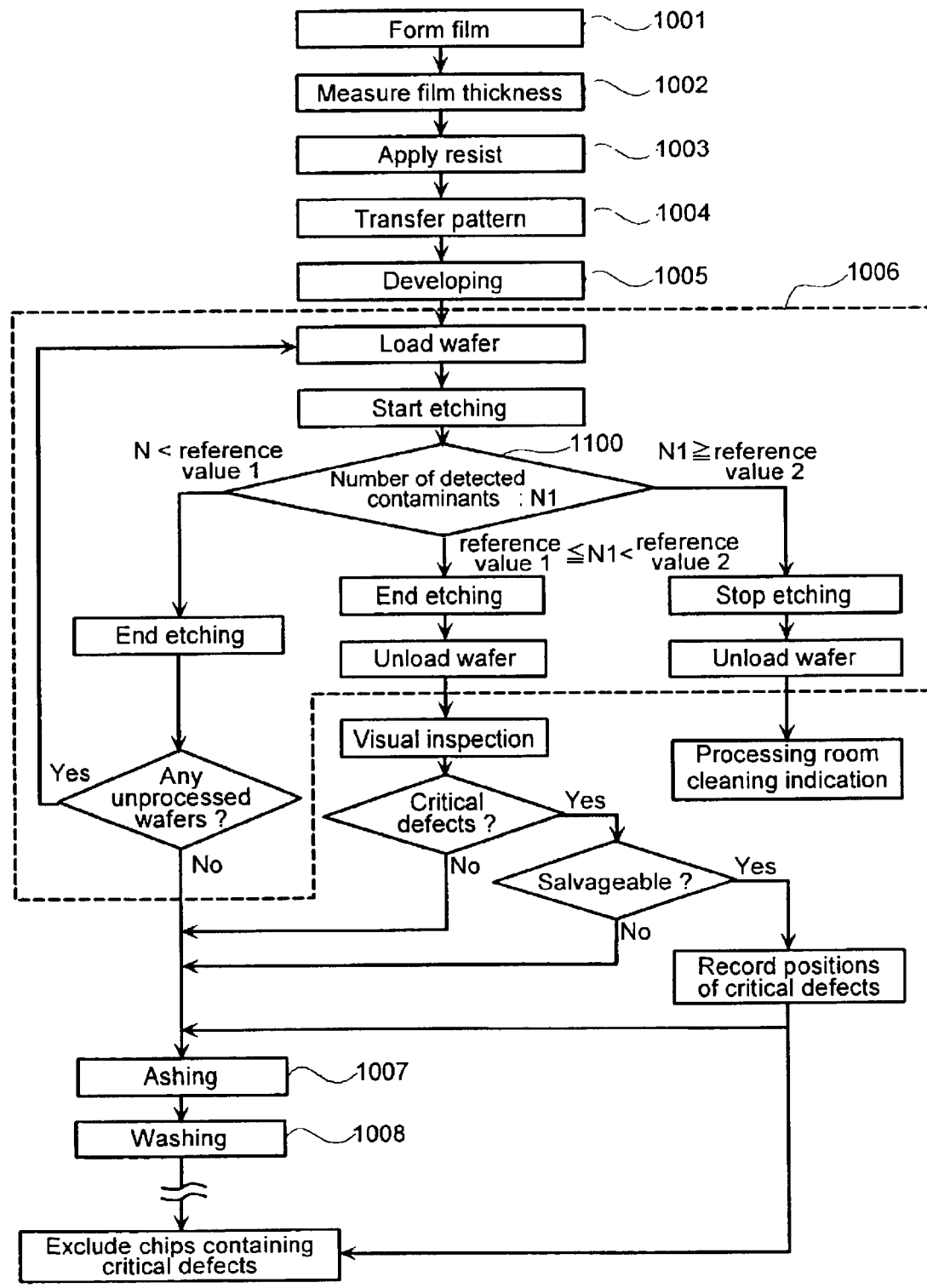
FIG. 25 is a flow chart of a production process for a semiconductor integrated circuit device involving an etching apparatus equipped with a device for measuring fine particles suspended in plasma according to the present invention.
Figure 26:
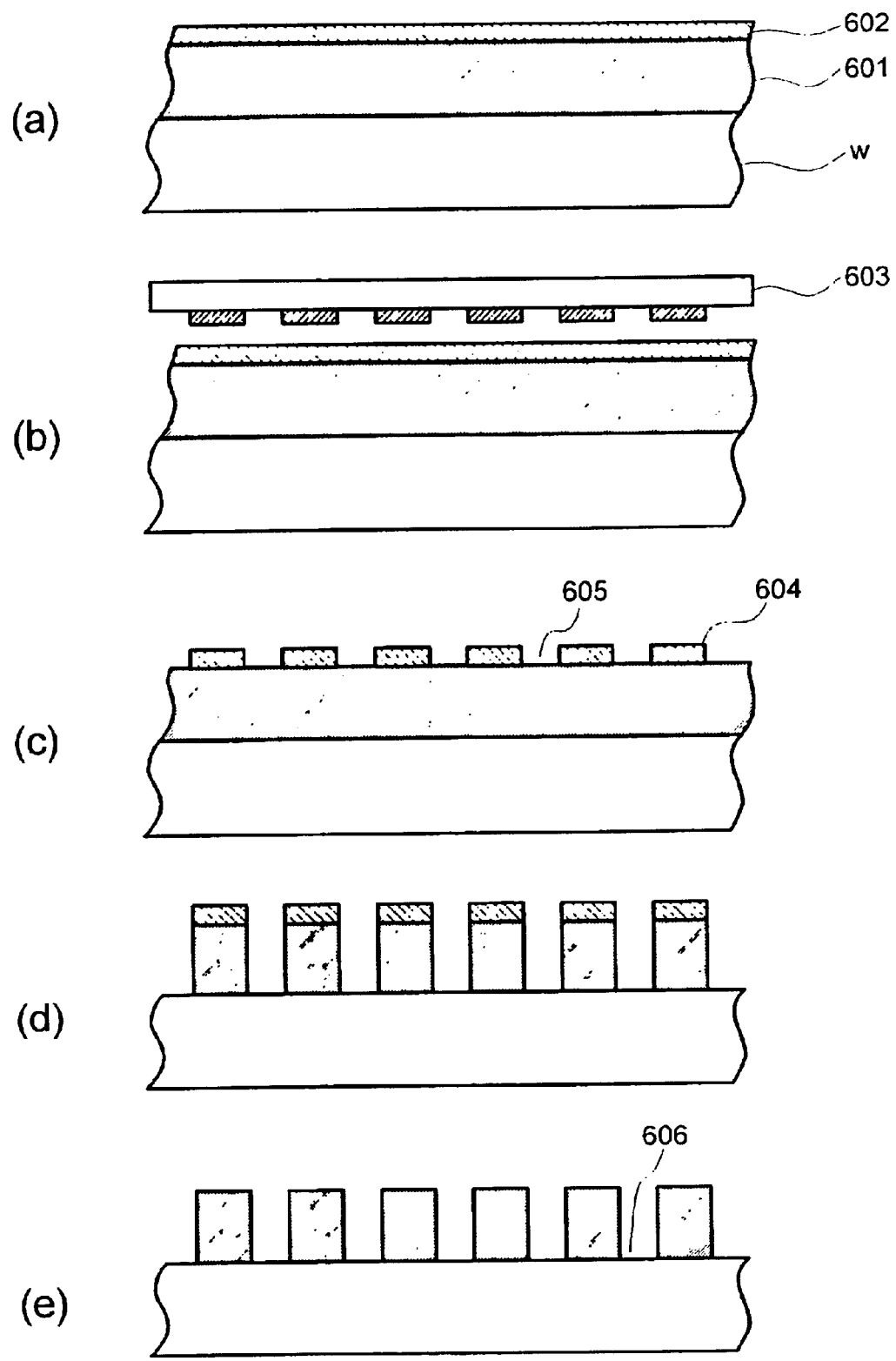
FIGS. 26(a) to 26(e) are cross sectional views showing steps in the formation of a semiconductor integrated circuit device for forming contact holes according to the present invention.

A sixth embodiment of the present invention will be described with reference to FIG. 24. In this embodiment, a gain regulator is disposed at each output of a three-channel synchronized detection unit. The structure of the optical system is the same as the one in the fifth embodiment, so its description will be omitted.

In addition to the advantages provided by the fifth embodiment described above, this embodiment allows detection to be performed by separating, over the wavelength and frequency domains, very weak back-scattered light generated by fine particles from the plasma illumination, as described in the first embodiment. Compared to conventional methods that provide separation only by wavelength, this results in significant improvements in the detection sensitivity for fine particles suspended in plasma, thus allowing detection of fine particles having diameters of approximately 0.2 microns, which could not be detected using conventional systems.

Furthermore, this embodiment compensates for the reduction in detection intensity caused by the lower energy density that accompanies the larger diameters of the illumination light beam spot at the point 1a toward the front of the wafer 70 and the point 2a toward the back of the wafer 70. This allows fine particle detection at a uniform sensitivity over the entire surface of the wafer.

Next, a seventh embodiment of the present invention will be described with reference to FIG. 25, FIGS. 26(a) to 26(e), and FIG. 27. First, using FIG. 25, FIGS. 26(a) to 26(e), and FIG. 27, an overview of a method for making semiconductor integrated circuit devices according to the present invention will be presented.

Step 1001 is a film forming step in which a film 601, such as a silicon oxide film, is formed on the wafer W. Step 1002 is a film thickness measuring step for inspecting the thickness of the film that was formed. Step 1003 is a resist applying step, in which a resist 602 is applied to the wafer W. Step 1004 is a pattern transfer step for transferring a mask pattern 603 to the wafer. Step 1005 is a developing step that eliminates the resist over the sections to be processed. Step 1006 is an etching step, where sections 605 of the film 601 are etched using the resist pattern 604 as a mask, thus forming circuit grooves and contact holes 606. Step 1007 is an ashing step that removes the resist pattern 604. Step 1008 is a cleaning step for cleaning the surface and back surface of the wafer. This series of steps is used, for example, to form contact holes. In standard semiconductor integrated circuit devices, this series of steps is repeated to form a multilayer structure.

Figure 27:
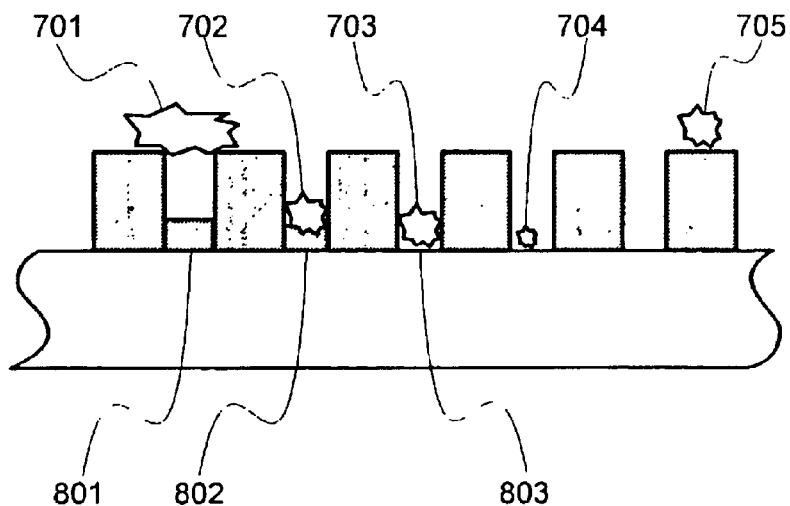
FIG. 27 is a cross sectional view of a semiconductor integrated circuit showing an example of defects generated by adhered contaminants in a contact hole etching process according to the present invention.
Figure 28:
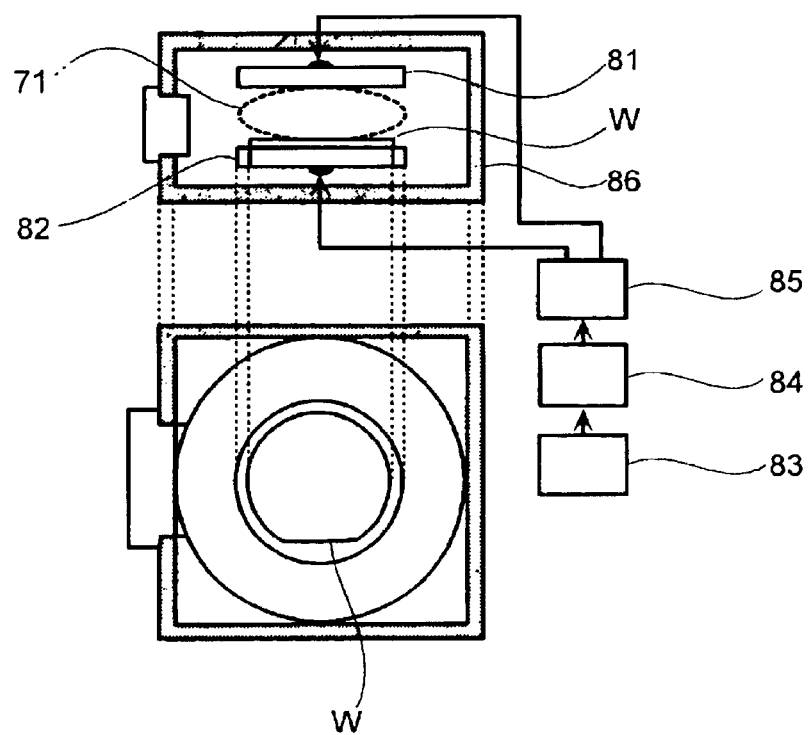
FIG. 28 is a view of a parallel electrodes type plasma etching apparatus.
Figure 29:
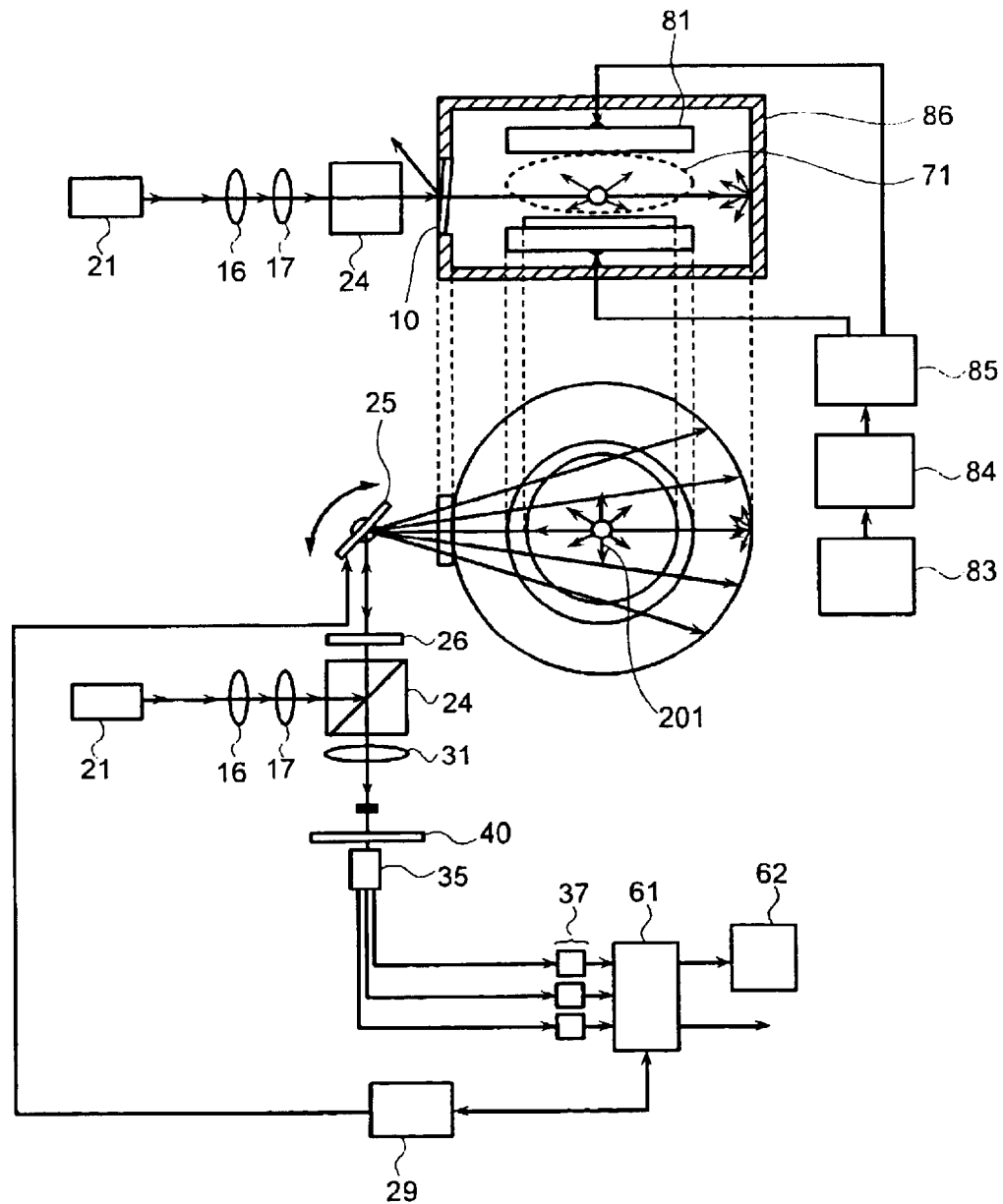
FIG. 29 is a view of a parallel electrodes type plasma etching apparatus equipped with a device for measuring fine particles suspended in plasma according to the present invention.

Next, with reference to FIG. 27, defects created by the adhesion to the wafer of fine particles generated during etching will be described. FIG. 27 shows an example in which defects are generated when contact holes are etched.

A fine particle 701 represents a fine particle which has adhered to a contact hole opening-during the etching operation. In this case, the adhered fine particle (contaminant) stops the etching reaction. This closes off the contact hole where the fine particle is attached, resulting in a critical defect.

A fine particle 702 represents a fine particle which has adhered inside a contact hole during the etching operation. The etching reaction is stopped in this case as well due to the adhesion of the fine particle (contaminant). This closes off the contact hole where the fine particle is attached, resulting in a critical defect.

A fine particle 703 and a fine particle 704 represent contaminants which have adhered inside contact holes after the etching operation is finished. In places such as contact holes that have high aspect ratios, contaminants can often be difficult to remove through cleaning. If the contaminant is large, as in the fine particle 703, a bad contact may result, causing a critical defect.

A fine particle 705 represents a contaminant which has adhered to the resist pattern 604 during etching. In this case, the adhered fine particle 705 does not affect the etching reaction at all. Thus, the adhered fine particle 705 will not lead to a critical defect.

In this manner, the adhesion of a fine particle will not lead to a critical defect if the size of the fine particle is not large enough to lead to a defect or if the position of the particle is in a non-etching region. Thus, even if fine particles are adhered to the wafer, not all of them will lead to critical defects. Also, while the fine particle 701 and the fine particle 705 are contaminants that can be easily cleaned off, removal through cleaning is difficult for contaminants that have dropped into a contact hole having a high aspect ratio, e.g., the fine particle 702, the fine particle 703, and the fine particle 704.

In accordance with the present invention, an apparatus 1100 for measuring fine particles suspended in a plasma is used at the etching step 1006 to detect in real time the fine particles generated in the processing chamber during etching. Based on these fine particle detection results, a decision is made to determine whether to send the processed wafer to the next step and continue processing the remaining wafers, whether to perform a visual inspection before sending the wafer to the next step, or whether to stop processing and perform cleaning (maintenance) of the processing chamber. In this case, the sizes and quantity of the detected fine particles are compared with predetermined reference values (fine particle management references) to determine the next operation to be performed.

Next, an example of a method for calculating these reference values (fine particle, management references) according to this embodiment will be described. As already described, the adhesion of fine particles on the wafer does not mean that all of these particles will lead to critical defects. The possibility that an adhered fine particle (contaminant) will lead to a critical defect can be determined by calculations based on the relationship between the numerical aperture, pattern density, circuit pattern width, and the like, as well as the sizes and quantity of the adhered fine particles. By performing prior testing to determine the correlation between the sizes and quantity of the fine particles detected during the etching operation and the sizes and quantity of the fine particles (contaminants) which have adhered to the wafer, the probability that fine particles detected during etching will lead to critical defects can be determined.

The reference values (fine particle management references) are determined based on values obtained using these means. The following is an example of how reference values are set up in this embodiment.

A reference value 1 is set so that, if the number of detected fine particles having a size no less than a certain size is less than the reference value 1, the probability of a critical defect is very low (e.g., a critical defect generation probability of no more than 1%). For example, the reference value 1 can be set to 10 for fine particle diameters of at least 0.4 microns.

A reference value 2 is set so that, if the number of detected fine particles having a size no less than a certain size is at or greater than the reference value 1 and less than the reference value 2, the possibility of a critical defect is a concern (e.g., a critical defect generation probability of no more than 5%). For example, the reference value 2 can be set to 30 for fine particle diameters of at least 0.4 microns.

If the detected fine particles have a size no less than a certain size and a quantity at or greater than the reference value 2, multiple critical defects may be generated (e.g., a critical defect generation probability of 5% or higher).

Based on these reference values, if the number of fine particles detected during etching that have a size no less than a certain size is less than the reference value 1, the probability that a critical defect will be generated is low, so that the next wafer can be processed.

If the number of fine particles detected during etching that have a size no less than a certain size is at least equal to the reference value 1, but is less than the reference value 2, a visual inspection is performed after the etching operation is completed. If no critical defects are found as a result of the visual inspection, the wafer is sent to the following ashing step 1007. If the visual inspection results in a critical defect being found, the critical defect is evaluated to see if it is a recoverable defect or not. If this evaluation indicates that the defect is recoverable (e.g., use of the recovered circuit), the wafer is sent to the next ashing step 1007. If this evaluation determines that the defect is not recoverable, the defect position is recorded and the wafer is sent to the next ashing step 1007. Then, when the individual chips are being cut out by dicing, for example, the chip containing the unrecoverable defect is thrown out.

If the number of fine particles detected during etching that have a size no less than a certain size is greater than the reference value 2, the wafer which is to undergo further processing is likely to generate a large number of critical defects. Thus, a display on the monitor or an alarm is used to notify the operator of the etching apparatus, so that the etching operation is stopped and cleaning (maintenance) is carried out in the plasma processing chamber.

With etching apparatuses not equipped with a device for measuring fine particles suspended in plasma, cleaning of the processing chamber is not necessarily carried out at appropriate times. Thus, cleaning may be performed at times when there is no need, thus reducing the availability of the apparatus. Conversely, the apparatus may continue processing even though the time to perform cleaning has passed, thus generating large numbers of defects and reducing the yield.

There is also a method for determining cleaning times by using a dummy wafer beforehand to check for fine particles in the processing chamber. This method inserts an extra operation in the series of production steps and reduces throughput while adding the cost of the dummy wafers to the overall cost. As the diameter of the wafers increase, the cost of dummy wafers will necessarily increases. Also, the need to reduce preparatory operations using dummy wafers to check for fine particles in the processing chamber has been a significant issue.

With this embodiment, wafer processing can be performed while also performing real-time monitoring of the contamination status inside the processing chamber. This allows the cleaning times to be optimized and eliminates the need for preparatory operations using dummy wafers. As a result, the throughput is increased and the cost of dummy wafers is eliminated. Also, products produced using the steps of this embodiment are high-quality products with a fine particle content no greater than a reference value. This allows highly reliable products to be produced.

In the above embodiment, an implementation for an etching apparatus was described. However, as noted earlier, the implementation of the present invention is not limited to this. For example, the present invention can be implemented for ashing apparatuses and film forming apparatuses to allow real-time monitoring of fine particles in ashing apparatuses and film forming apparatuses. This can reduce defects occurring in film forming steps and ashing steps within photolithography operations, thus preventing defects and improving yield.

With etching apparatuses not equipped with a fine particle monitoring apparatus (the apparatus 1100 for measuring fine particles Suspended in plasma), the processing chamber is not necessarily cleaned at appropriate times. Thus, cleaning may take place when it is not actually needed, thus reducing throughput. Conversely, processing may continue even though the time to perform cleaning has already passed, thus leading to large numbers of defects and reducing the yield.

Since the present invention uses back scattered light detection, the illumination/detection optical systems can be formed as a single unit. This allows attachment and adjustments to be performed easily and provides a compact fine particle detection apparatus.

Also, detection of back scattered light can be performed so that the light reflected from the observation window surface and light scattered by the processing chamber walls are not detected. Furthermore, very weak back scattered light signals generated by fine particles are separated from plasma illumination noise, which obstructs detection of fine particles in plasma. This improves the detection sensitivity and also allows detection of fine particles on the order of submicrons, something which was believed to be difficult with conventional methods.

Furthermore, during the scanning of the illumination light, the illumination/detection optical system is able to slide up and down. This allows different plasma regions to be measured and allows fine particles to be detected over the entire wafer surface, providing information on the quantity, sizes, and distribution of the fine particles. With this fine particle detection apparatus, the user can check this information on a display in real time.

Furthermore, with this information, the contamination status in the processing chamber can be evaluated in real time on the basis of the obtained quantity, size, and distribution information for the fine particles. As a result, cleaning times can be determined optimally, and semiconductor devices can be produced with high throughputs and good yields.

Also, since the number of fine particles in the processing chamber can be continuously monitored while operations are taking place, highly reliable high-quality circuit substrates with fine particle contents of no greater than a reference value can be produced.

An eighth embodiment of the present invention will be described with reference to FIG. 31 and FIG. 32.

First, before describing the eighth embodiment of the present invention, a standard process flow for a method for producing semiconductor integrated circuits based on a conventional technology will be described with reference to FIG. 32. This example uses an oxide film etching process, represented by trench and through-hole etching in Cu dual damascene processes. This is used in contact hole etching for 256 Mbit DRAMs and high-speed CMOS, LSI, and the like using a 0.18 micron process or better. In the process flow described below, an etching process is used in which two different processing operations are performed consecutively in a single operation to etch, film formed on the wafer surface using a different material. The process flow described below can be implemented using the UNITY-IEM parallel flat oxide film etching apparatus from Tokyo Electron Corp. or the like.

First, at step 1, the operator selects a process recipe from a list of process recipes containing process parameters for different process flows as determined beforehand through calculations or testing. The process parameters take into account film material, etching depth, and the like.

Next, at step 2, the temperature of the lower electrode on which the wafer is to be mounted is set. At step 3, the wafer is loaded. At step 4, a process gas such as a mixed gas composed from $C_4F_8$, Ar, and $O_2$ is supplied through a shower plate on the upper electrode. After the gas is supplied at step 4, RF power is applied at step 5 to generate a plasma when the pressure in the processing chamber reaches a stable state, e.g., when a pressure of 4 [Pa] is reached. At step 6, the plasma begins the etching operation. At step 7, the etching operation is performed for a predetermined time, e.g., 60 [s]. Then, at step 8 the etching operation is finished. After the etching operation is finished at step 8, the RF power is stopped at step 9. Purge gas is supplied at step 10 to remove residual process gas.

At this point some of the suspended fine particles are removed from the processing chamber along with the purge gas. The operations described above complete the first etching operation.

Then, the second etching operation is performed. At step 11, a process gas such as $CF_4$ is supplied. After the gas is supplied at step 11, RF power is applied at step 12 to generate a plasma when the pressure in the processing chamber reaches a stable state, e.g., when a pressure of 7 [Pa] is reached. At step 13, the plasma begins the etching operation. At step 14, the etching operation is performed for a predetermined time, e.g., 30 [s]. Then, at step 15, the etching operations is finished. After the etching operation is finished at step 15, the RF power is stopped at step 16. Purge gas is supplied at step 10 to remove residual process gas. At this point some of the suspended fine particles are removed from the processing chamber along with the purge gas. The operations described above complete the second etching operation, and the wafer is unloaded.

In this process flow, a mass flow controller 10001, an RF power controller 10002, and the like that comes with the etching apparatus continuously monitors gas flow volume, RF power, and the like. If the results from the monitoring are inconsistent with the settings described above, the feeding of process gas and the application of RF power are stopped and the etching operation is halted.

Figure 31:
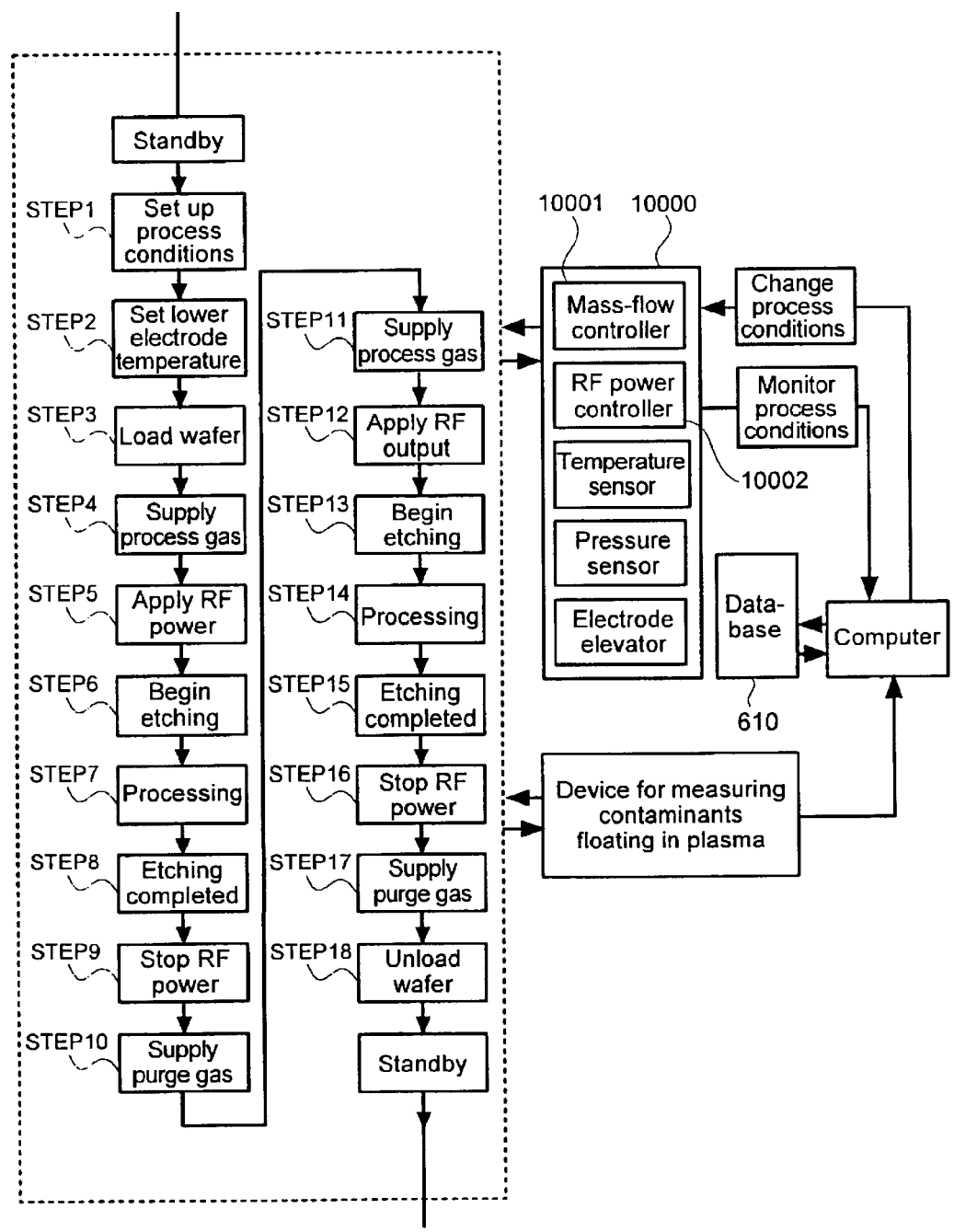
FIG. 31 is a flowchart showing an example of a process flow for oxide film etching according to the present invention.
Figure 32:
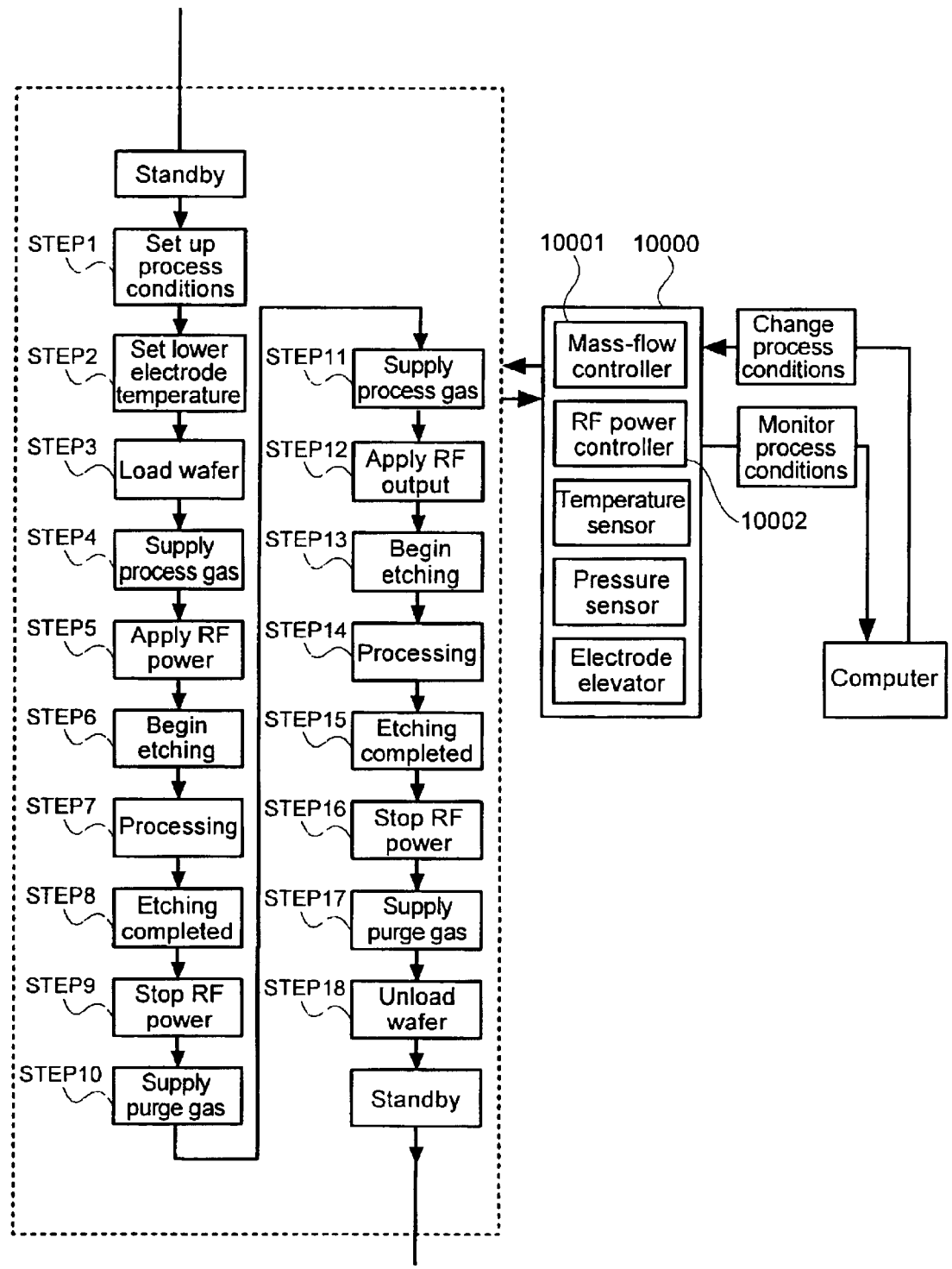
FIG. 32 is a flowchart showing an example of a process flow for oxide film etching using an etching apparatus equipped with an apparatus for measuring fine particles suspended in plasma according to the present invention.

FIG. 31 shows an improved version of the process flow shown in FIG. 32. In the new process flow described below, elements having the same structure and functions as that of the process flow of the conventional technology are assigned the same numerals. This process flow differs from the Conventional technology process flow shown in FIG. 32 in that an apparatus for measuring fine particles suspended in plasma, as described in the first embodiment through the seventh embodiment, is newly provided. The fine particles suspended in the process chamber are monitored continuously from step 1 right before the process gas is supplied to when the wafer is unloaded at step 18 as well as when the plasma etching apparatus is in standby state. Of course, the apparatus for measuring particles suspended in plasma according to the first embodiment through the sixth embodiment uses a detection principle such that not only is it effectively detecting fine particles when plasma illumination is present but also fine particle detection is possible when plasma emission is not present.

The apparatus for measuring fine particles suspended in plasma can, through a computer, control the mass flow controller 10001, the RF power controller 10002, and the like that are accessories to the plasma etching apparatus. Process control can be performed for starting and stopping RF power, starting and stopping gas, changing the gas flow, changing the gas type, and the like. At each step, the computer obtains at least one of the following from the apparatus for measuring fine particles suspended in plasma: the number of fine particles; the diameter of fine particles; and the distribution of fine particles. This information is compared to fine particle management information calculated beforehand or based on tests performed beforehand and recorded in a database 610. Process control is performed based on the results of these comparisons. In particular, with Cu dual damascene processes, the numerical aperture can reach up to 50%. Since the tolerance range for fine particles (contaminants) that have adhered to the wafer narrows, it may be necessary to not only detect fine particles generated during the processes, but also to control the processes based on results of the fine particle detection.

The characteristics (process control examples) of the method of producing semiconductor integrated circuits with the use of a feature for measuring fine particles suspended in plasma are described below.

In the purge gas supplying step 10, suspended fine particles are removed from the processing chamber along with the purge gas. Thus, the number of fine particles in the processing chamber is reduced over time. The number of fine particles removed by the purge gas, i.e., the number of fine particles suspended in the processing chamber, will vary, of course, with the contamination status in the processing chamber. In this equipment provided with a feature for measuring fine particles suspended in plasma, step 11 is begun after confirming that fine particles suspended in the processing chamber have been adequately removed along with the purge gas. In the conventional technology, the feeding of the purge gas is simply performed over a predetermined period of time before step 8 is begun. This can lead to the process gas being supplied at step 11 for the second etching operation when there is a large number of fine particles in the processing chamber. In contrast, this embodiment starts the etching operation from an initial state with a low number of fine particles in the processing chamber.

At step 3, it is possible that a portion of the deposited film formed on the wafer loading opening peels off due to friction or the like when the wafer loading opening of the processing chamber opens to load a wafer. Then, the flow of purge gas can be disrupted in the newly formed space between the processing chamber and the wafer loading system so that this portion of the deposited film becomes suspended in the processing chamber. If fine particles are detected when the loading opening opens, the wafer is not loaded immediately into the processing chamber. Instead, the wafer may, for example, be kept mounted on the loading arm and wait to be loaded until the fine particle count in the processing chamber has been adequately reduced. The etching process starting with step 4 can then be performed.

In the two examples described above, the process flow is controlled in between individual steps based on results obtained from measuring fine particles suspended in the plasma. However, the apparatus for measuring fine particles suspended in plasma according to the present invention can provide real-time detection of suspended fine particles generated in the processing chamber while plasma processing is taking place. Thus, based on results from monitoring fine particles during etching operations, the fine particle management operations described in the seventh embodiment can be performed in step 6 through step 9 and step 12 through step 16.

If, in any of the steps, a large number of fine particles is found and measures to prevent adhesion of fine particles to the wafer are found to be impossible no matter what means are used, processing is stopped immediately and the operator is notified that maintenance should be performed on the etching apparatus.

Possible implementations of process control are not limited to what is described above. It would be possible to store relations between fine particle generation status captured by the computer and individual processes. These stored results can serve as a database to add new process control means as appropriate. In addition to providing process control, if it is found that changes should be made to the contents of the process recipe selected in step 1 before wafer processing is begun, the settings of the process conditions can be changed. Thus, with this embodiment, better process conditions can be determined as more operations are performed.

If the etching apparatus is not equipped with a fine particle monitoring apparatus (the apparatus 1100 for measuring fine particles suspended in plasma), the steps in the process flow cannot be started at appropriate times. Thus, wafer operations are not necessarily performed under optimal conditions. When operations are begun or continued while fine particles are present in the processing chamber, large numbers of defective products may result and the yield may be reduced.

Preparatory operations can be performed to check for fine particles in the processing chamber using dummy wafers, thus allowing the status of fine particles in the processing chamber to be known. However, the status in the processing chamber when the preparatory operation is performed with the dummy wafer is not necessarily the same as when the product is being processed. Thus, the process conditions cannot be directly controlled.

In contrast, this embodiment allows the product to be processed while providing real-time monitoring of the contamination status in the processing chamber at each step in the process flow based on obtained information regarding the quantity, size, and distribution of fine particles. This allows process conditions to be changed to optimal values as appropriate based on the contamination status in the processing chamber. Furthermore, since the timing at which each of the steps is begun can be set, the process now can be optimized. Since preparatory operations using dummy wafers are not needed, the throughput can be improved while reducing dummy wafer costs. Also, products made using the steps of this embodiment can provide high-quality products containing a number of fine particles no greater than a reference value. Thus, highly reliable products can be made.

In the above description, the embodiment is implemented for etching apparatuses. However, as noted earlier, the implementation of the present invention is not limited to this. For example, the present invention can be implemented for ashing apparatuses and film forming apparatuses to allow real-time monitoring of fine particles in ashing apparatuses and film forming apparatuses. This can reduce defects occurring in film forming steps and ashing steps within photolithography operations, thus preventing defects and improving yield.

Since the present invention as described above uses back scattered light detection, the illumination/detection optical systems can be formed as a single unit. This allows attachment and adjustments to be performed easily and provides a compact fine particle detection apparatus.

Also, detection of back scattered light can be performed so that the light reflected from the observation window surface and light scattered by the processing chamber walls are not detected. Furthermore, very weak back-scattered light signals generated by fine particles are separated from plasma illumination noise, which obstructs detection of fine particles in the plasma. This improves the detection sensitivity and also allows detection of fine particles on the order of submicrons, something which was believed to be difficult with conventional methods.

Furthermore, during the scanning of the illumination light, the illumination/detection optical system is able to slide up and down. This allows different plasma regions to be measured and allows fine particles to be detected over the entire wafer surface, providing information on the quantity, sizes, and distribution of the fine particles. With this fine particle detection apparatus, the user can check this information on a display in real time.

Furthermore, with this information, the contamination status in the processing chamber can be evaluated in real time on the basis of the obtained quantity, size, and distribution information for the fine particles. As a result, cleaning times can be determined optimally, and semiconductor devices can be produced with high throughputs while preventing clusters of defects and improvising yields. Also, since the processing can take place while the fine particle count in the processing chamber is continuously monitored, circuit substrates produced in this manner will be highly reliable high-quality products that contain a number of fine particles that is less than a reference number.

Also, since the present invention does not require evaluation of the contamination status in the processing chamber using a dummy wafer or random inspections, dummy wafer costs can be reduced and the throughput can be improved.

Furthermore, the present invention allows the quantity and positions of fine particles to be detected over the entire surface of the wafer through the use of a long-focus beam and axially offset multi-level detection. Thus, compared to conventional methods, a more detailed evaluation of fine particles suspended in plasma is possible.

Also, it is possible to combine the present invention with a detection method that separates the very weak back-scattered light generated by fine particles from plasma emission across the wavelength and frequency domains, whereby the detection sensitivity for fine particles suspended in plasma can be significantly improved over conventional methods and the quantity and positions of fine particles over the entire surface of the wafer can be detected. This provides more stable and detailed evaluations of fine particles suspended in plasma compared to conventional methods.

Furthermore, by adding gain regulation to the outputs from the channels of axially offset multi-level detection, variations in detection sensitivity caused by differences in illumination energy from the illumination beam can be compensated. Thus, fine particles suspended over the entire wafer surface can be detected in a stable manner with a uniform detection sensitivity.

These advantages allow the real-time monitoring of the contamination status in the etching processing chamber. This makes possible the production of high-quality semiconductor elements while reducing the generation of defective wafers due to adhered fine particles (contaminants). Also, an accurate determination can be made of apparatus cleaning times.

Also, since the frequency of preparatory operations to check for fine particles using dummy wafers can be reduced, costs can be reduced and productivity can he improved. Also, the production line can be automated.

What is claimed is:

1. A method of processing a semiconductor device, comprising the steps of:
   generating plasma in a processing chamber to form or to process a thin film on a semiconductor device;
   scanning an intensity modulated P-polarized laser beam inside the processing chamber through a window of the processing chamber which has a Brewster's angle relative to the P-polarized laser beam where the semiconductor device is being processed by the plasma;
   receiving, by a sensor through the window of the processing chamber, a back scattered light scattered from fine particles suspended inside the processing chamber by scanning the laser beam, the back scattered light being scattered at different portions along an optical axis of the laser beam and respectively received by the sensor;
   detecting a desired frequency component from a signal outputted from the sensor;
   obtaining information from a detected frequency component relating to a quantity, a size and a distribution of fine particles illuminated by the laser beam inside the processing chamber; and
   outputting obtained information relating to the quantity, the size and the distribution of the fine particles.

2. A method of processing a semiconductor device, comprising the steps of:
   generating plasma in a processing chamber to form or to process a thin film on a semiconductor device;
   scanning an intensity modulated laser beam inside the processing chamber through a window of the processing chamber where the semiconductor device is being processed by the plasma;
   receiving, by a sensor through the window of the processing chamber, a back scattered light scattered from fine particles suspended inside the processing chamber by scanning the laser beam while cutting off light reflected from a wall of said processing chamber, the back scattered light being scattered at different portions alone an optical axis of the laser beam and respectively received by the sensor;
   detecting a desired frequency component from a signal outputted from the sensor;
   obtaining information from a detected frequency component relating to a quantity, a size and two dimensional distribution information of the fine particles along an optical axis and a scan direction of the laser beam inside the processing chamber; and
   outputting obtained information relating to the quantity, the size and the distribution of the fine particles.

3. A method according to claim 2, wherein the desired frequency component for modulating the laser beam is different from a frequency for generating the plasma inside the processing chamber.

4. A method of processing a semiconductor device, comprising the steps of:
   coating a resist on a surface of a substrate;
   exposing the resist coated on the substrate with a desired light pattern;
   developing the exposed resist;
   processing the substrate with plasma and the surface of the substrate is partially covered with the developed resist; and
   removing the resist coated on the substrate on which patterns are formed;
   wherein in the processing step, the substrate is processed in a processing apparatus and a laser beam is scanned inside the processing apparatus through a window of the processing apparatus and a back scattered light from fine particles by the scanned laser beam is detected through the window, the back scattered light being scattered at different portions along an optical axis of the laser beam and respectively detected through the window to obtain two dimensional distribution information of fine particles along the optical axis and the scan direction of the laser beam inside the processing chamber.

5. A method according to claim 4, wherein information of distribution of fine particles suspending inside the processing apparatus is obtained from the back scattered light.

6. A method of processing a semiconductor device, comprising the steps of:
   forming a thin film on a substrate;
   coating a resist on the substrate on which the thin film is formed;
   exposing the resist with a light pattern by using an exposing apparatus;
   etching the thin film on which the resist is developed and forming hole patterns by using a plasma etching apparatus; and
   removing the resist coated and developed on the substrate on which the hole patterns are formed in the thin film;
   wherein in said etching step, a laser beam is scanned inside the plasma etching apparatus where a plasma is generated and a back scattered light from fine particles suspended inside the plasma etching apparatus is detected by a sensor separated from light reflected from a wall of the plasma etching apparatus, the back scattered light being scattered at different portions along an optical axis of the laser beam and respectively received by the sensor and two dimensional distribution information of fine particles suspended inside the plasma etching apparatus is obtained from the back scattered light at different portions along the optical axis of the laser beam on the substrate.

7. A method according to claim 6, wherein an intensity of said laser beam scanning inside said plasma etching apparatus is modulated at a desired frequency.

8. A method according to claim 6, wherein information regarding sizes and distribution of fine particles suspended inside said plasma etching apparatus is obtained from the back scattered light at different portions along the optical axis of the laser beam on the substrate.

9. A method according to claim 6, wherein the two dimensional distribution information includes a distribution of fine particles along an optical axis and a scan direction of the laser beam.

10. A method according to claim 6, wherein the two dimensional distribution information regarding the distribution of fine particles is displayed on a monitor.

11. A method according to claim 6, wherein information regarding contamination inside the plasma etching apparatus is obtained from the back scattered light at different portions along the optical axis of the laser beam on the substrate.

12. A method of processing a semiconductor device comprising the steps of:

loading a substrate into a chamber of a plasma etching apparatus, on a surface of the substrate, a resist pattern is formed;

evacuating inside the chamber in which the substrate is loaded and supplying a process gas inside the chamber;

applying high frequency power to an electrode of the plasma etching apparatus and generating plasma inside the chamber;

processing the substrate with plasma;

illuminating a laser beam inside the chamber through a window of the plasma etching apparatus and detecting through the window a back scattered light generated by fine particles suspended inside the chamber, the back scattered light being scattered at different portions along an optical axis of the laser beam and respectively detected through the window and obtained two dimensional distribution information of fine particles at different portions along the optical axis of the laser beam on the substrate; and unloading the substrate from the plasma etching apparatus after stopping supply of the process gas and evacuating the process gas from inside the chamber.

13. A method according to claim 12, wherein an intensity of the laser beam illuminated inside the chamber is modulated at a desired frequency.

14. A method according to claim 12, wherein information is obtained from the back scattered light regarding fine particles suspended inside the chamber.

15. A method according to claim 14, wherein obtained information regarding the fine particles is information regarding sizes and distribution of fine particles suspended Inside the chamber.

16. A method according to claim 15, wherein said information regarding sizes and distribution of fine particles suspended inside the chamber is displayed on a monitor.

17. A method according to claim 12, wherein, based on a detection signal detected from light scattered by said fine particles, information regarding contamination status inside the plasma etching apparatus is obtained.

18. A method according to claim 12, wherein information regarding contamination inside the plasma etching apparatus is obtained from the back scattered light.

19. A method of processing a semiconductor device, comprising:

generating plasma in a processing chamber to form a thin film on a semiconductor device or to process a thin film formed on a semiconductor device;

scanning an intensity modulated laser beam that is polarized inside the processing chamber through an observation window of the processing chamber arranged at a Brewster's angle relative to the laser beam; and obtaining two dimensional distribution information of fine particles by respectively detecting a back scattered light from fine particles suspended inside the processing chamber at different portions along an optical axis of the laser beam on the semiconductor device.

20. A method according to claim 19, wherein the two dimensional distribution information of fine particles includes a quantity, a size and a distribution of fine particles along an optical axis and a scan direction of the laser beam.

* * * * *